US012787467B2

(12) United States Patent
Kim et al.

(10) Patent No.: US 12,787,467 B2
(45) Date of Patent: Nov. 3, 2026

(54) IMAGE SENSOR AND METHOD OF MANUFACTURING THE SAME

(71) Applicant: Samsung Electronics Co., Ltd., Suwon-si (KR)

(72) Inventors: Minkwan Kim, Suwon-si (KR); Minsung Heo, Suwon-si (KR); Jongwoo Hong, Suwon-si (KR); Insung Joe, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 283 days.

(21) Appl. No.: 18/495,179

(22) Filed: Oct. 26, 2023

(65) Prior Publication Data

US 2024/0153975 A1 May 9, 2024

(30) Foreign Application Priority Data

Nov. 7, 2022 (KR) ........................ 10-2022-0147383

(51) Int. Cl.
*H10F 39/00* (2025.01)

(52) U.S. Cl.
CPC ....... *H10F 39/8053* (2025.01); *H10F 39/024* (2025.01); *H10F 39/8063* (2025.01)

(58) Field of Classification Search
CPC ......... H10F 39/8053; G01J 3/26; G02B 5/288
See application file for complete search history.

(56) References Cited

U.S. PATENT DOCUMENTS 10,566,364 B2 2/2020 Zheng et al.
11,231,534 B2 1/2022 Toda
2006/0199295 A1* 9/2006 Hong .................... H10F 39/026 438/48

(Continued)

FOREIGN PATENT DOCUMENTS

CN 112229515 A 1/2021
KR 10-2020-0146008 A 12/2020
KR 10-2022-0003955 A 1/2022

OTHER PUBLICATIONS

Yuichi Inaba, et al. "Degradation-free MOS image sensor with photonic crystal color filter." *IEEE electron device letters*, vol. 27, No. 6 (2006): 457-459.

(Continued)

*Primary Examiner* — Christopher A Johnson
(74) *Attorney, Agent, or Firm* — HARNESS, DICKEY & PIERCE, P.L.C.

(57) ABSTRACT

An image sensor includes a substrate including a plurality of photoelectric conversion devices, a color filter arranged on the substrate, a reflective absorption layer on the color filter and comprising at least one of tungsten, titanium, and aluminum, an anti-reflective layer arranged on the reflective absorption layer, and a plurality of micro lenses on the anti-reflective layer. The color filter may include a plurality of dielectric layers extending in a first direction that is parallel to a rear surface of the substrate, the plurality of dielectric layers having different thicknesses in a second direction that is perpendicular to the rear surface of the substrate and perpendicular to the first direction, such that the plurality of dielectric layers includes at least one dielectric layer having a thickness in the second direction that varies along the first direction.

20 Claims, 22 Drawing Sheets

(56) References Cited

U.S. PATENT DOCUMENTS

| | | | | |
|---|---|---|---|---|
| 2012/0268809 | A1 | 10/2012 | Guo et al. | |
| 2016/0204143 | A1* | 7/2016 | Lee | H10F 39/807 257/446 |
| 2020/0033519 | A1 | 1/2020 | Toda | |
| 2020/0386620 | A1 | 12/2020 | Toda | |
| 2020/0403023 | A1* | 12/2020 | Huang | H04N 25/76 |
| 2020/0408598 | A1* | 12/2020 | Toda | H10F 39/806 |
| 2021/0152790 | A1 | 5/2021 | Sugizaki | |
| 2022/0003906 | A1* | 1/2022 | Kim | G02B 5/288 |
| 2022/0375986 | A1* | 11/2022 | Rosenblum | H10F 39/8063 |

OTHER PUBLICATIONS

Korean Office Action dated Aug. 6, 2026 for corresponding Korean Patent Application 10-2022-0147383 and its English-language translation.

* cited by examiner

IMAGE SENSOR AND METHOD OF MANUFACTURING THE SAME

CROSS-REFERENCE TO RELATED APPLICATION

This application is based on and claims priority under 35 U. S. C. § 119 to Korean Patent Application No. 10-2022-0147383, filed on Nov. 7, 2022 in the Korean Intellectual Property Office, the disclosure of which is incorporated by reference herein in its entirety.

BACKGROUND

Various example embodiments relate to image sensors, more particularly, to image sensor including a reflective absorption layer and/or methods of manufacturing the same.

An image sensor is or includes a device that captures a two-dimensional and/or three-dimensional image of an object. The image sensor generates an image of the object by using a photoelectric conversion element that reacts according to the intensity of light reflected from the object. Recently, a complementary metal-oxide semiconductor (CMOS)-based image sensor capable of implementing high resolution is being widely used.

SUMMARY

Various example embodiments provide an image sensor with improved transmittance and/or resolution, and/or a method of manufacturing the image sensor.

However, example embodiments are not limited to the above description, and other inventive concepts may be clearly understood by those of ordinary skill in the art from the descriptions below.

According to some example embodiments, there is provided an image sensor including a substrate including a plurality of photoelectric conversion devices, a color filter on the substrate, a reflective absorption layer on the color filter and comprising at least one of tungsten, titanium, or aluminum, an anti-reflective layer on the reflective absorption layer, and a plurality of micro lenses on the anti-reflective layer. The color filter includes a plurality of dielectric layers extending in a first direction that is parallel to a rear surface of the substrate, the plurality of dielectric layers having different thicknesses in a second direction that is perpendicular to the rear surface of the substrate and perpendicular to the first direction, such that the plurality of dielectric layers includes at least one dielectric layer having a thickness in the second direction that varies along the first direction.

Alternatively or additionally, according to some example embodiments, there is provided an image sensor including a substrate including a plurality of photoelectric conversion devices, a color filter on the substrate, a reflective absorption layer on the color filter and comprising at least one of tungsten, titanium, or aluminum, an anti-reflective layer arranged on the reflective absorption layer, a plurality of micro lenses that are spaced apart from the substrate with the color filters between the substrate and the plurality of micro lenses, the plurality of micro lenses on the reflective absorption layer, a plurality of conductive patterns configured to define at least one conductive path to output electrical signals generated by the plurality of photoelectric conversion devices, and an interlayer insulating layer covering the plurality of conductive patterns. The color filter includes a plurality of dielectric layers extending in a first direction parallel to a rear surface of the substrate and sequentially stacked in a second direction perpendicular to the rear surface of the substrate and perpendicular to the first direction, wherein the plurality of dielectric layers comprise first to eighth dielectric layers sequentially stacked on the plurality of photoelectric conversion devices, and the reflective absorption layer is configured to re-reflect light reflected from the plurality of dielectric layers toward the reflective absorption layer, such that the re-reflected light is reflected toward the plurality of dielectric layers.

Alternatively or additionally, according to some example embodiments, there is provided an image sensor including a substrate including a plurality of photoelectric conversion devices that define a matrix, a color filter on the substrate and comprising a blue filter, a green filter, and a red filter that are on separate, respective photoelectric conversion devices of the plurality of photoelectric conversion devices, a reflective absorption layer on the color filter and including at least one of tungsten, titanium, or aluminum, an anti-reflective layer on the reflective absorption layer and configured to transmit visible rays; a plurality of micro lenses on the reflective absorption layer, configured to focus external light on the plurality of photoelectric conversion devices and spaced apart from the substrate with the color filter between the substrate and the plurality of micro lenses, a plurality of conductive patterns configured to define at least one conductive path to output electrical signals generated by the plurality of photoelectric conversion devices, and an interlayer insulating layer covering the plurality of conductive patterns. The color filter includes a plurality of dielectric layers extending in a first direction parallel to a rear surface of the substrate and sequentially stacked in a second direction perpendicular to the rear surface of the substrate and perpendicular to the first direction. The plurality of dielectric layers may include first to eighth dielectric layers sequentially stacked on the plurality of photoelectric conversion devices in the second direction, and the reflective absorption layer may be configured to re-reflect external light reflected from the plurality of dielectric layers toward the reflective absorption layer, such that the re-reflected light is reflected toward to the plurality of dielectric layers.

BRIEF DESCRIPTION OF THE DRAWINGS

Various example embodiments will be more clearly understood from the following detailed description taken in conjunction with the accompanying drawings in which.

DETAILED DESCRIPTION

Figure 1:
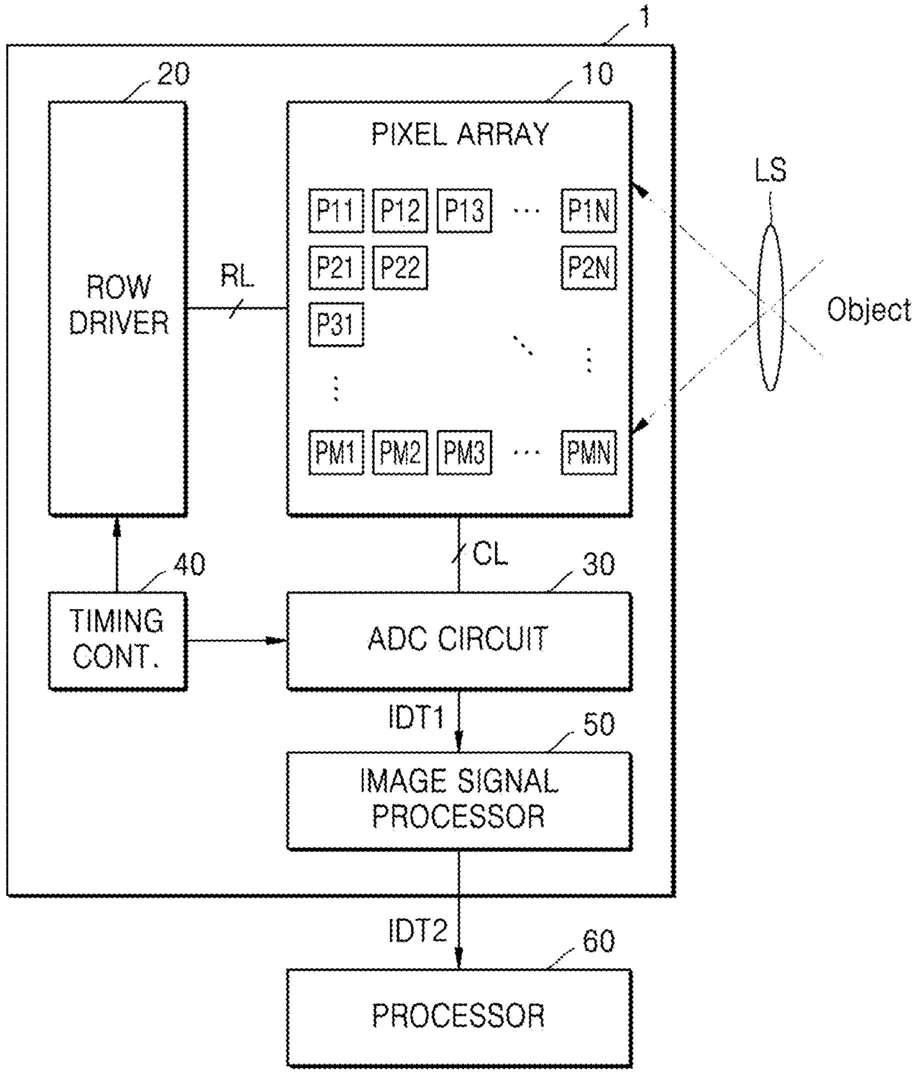
FIG. 1 is a block diagram illustrating an image sensor according to some example embodiments.

Hereinafter, some example embodiments of inventive concepts will be described in detail with reference to the accompanying drawings. The same reference numerals are used for same components in the drawings, and repeated description thereof will be omitted.

Hereinafter, the terms "above" or "on" may include not only those that are directly on in a contact manner, but also those that are above in a non-contact manner. The singular forms "a," "an," and "the" as used herein are intended to include the plural forms as well unless the context clearly indicates otherwise. It will be understood that the terms "comprise," "include," or "have" as used herein specify the presence of stated elements, but do not preclude the presence or addition of one or more other elements.

The use of the term "the" and similar demonstratives may correspond to both the singular and the plural. Operations constituting methods may be performed in any suitable order unless otherwise indicated herein or otherwise clearly contradicted by context, and are not necessarily limited to the stated order.

The use of all illustrations or illustrative terms in some example embodiments is simply to describe the technical ideas in detail, and the scope of the present inventive concepts is not limited by the illustrations or illustrative terms unless they are limited by claims.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

FIG. 1 is a block diagram illustrating an image sensor 1 according to some example embodiments.

Referring to FIG. 1, an image sensor 1 according to some example embodiments may be mounted on an electronic device having an image-generating or light-sensing function. For example, the image sensor 1 may be applied to (e.g., included in) electronic devices such as a camera, a smartphone, a wearable device, an Internet of Things (IoT), a tablet personal computer (PC), a personal digital assistant (PDA), a portable multimedia player (PMP), a navigation device, etc. In addition, the image sensor 1 may be used in vehicles, furniture, manufacturing facilities, doors, and various measuring instruments.

The image sensor 1 may include a pixel array 10, a row driver 20, an analog-digital conversion circuit (hereinafter referred to as ADC circuit) 30, a timing controller 40, and an image signal processor 50.

The pixel array 10 may receive an optical signal reflected from an object that is incident through a lens LS and may convert the optical signal into an electrical signal. The pixel array 10 may be implemented as a complementary metal-oxide semiconductor (CMOS) image sensor, but is not limited thereto. The pixel array 10 may a portion of the charge coupled-device (CCD) chip.

The pixel array 10 may include a plurality of pixels P11, P12, P13, . . . , P1N, P21, P22, . . . P2N, P31, . . . PM1, PM2, PM3, . . . PMN (hereinafter referred to as P11 to PMN) that are connected to a plurality of row lines RL, a plurality of column lines CL (or output lines), and a plurality of row lines RL and column lines CL, and are arranged in M columns and N rows, where "M" and "N" may each independently be any integer. In the present example, the number of the plurality of pixels P11 to PMN may be m×n, where "m" and "n" may each independently be any integer.

Each of the plurality of pixels P11 to PMN may use a photoelectric conversion device to sense optical signals being received. The plurality of pixels P11 to PMN may detect the amount of light of the optical signals and output an electrical signal indicating the detected amount of light.

The row driver 20 may generate a plurality of control signals that may control the operation of the pixels P11 to PMN arranged in each row according to the control of the timing controller 40. The row driver 20 may provide the plurality of control signals to each of the plurality of pixels P11 to PMN of the pixel array 10 through the plurality of row lines RL. In response to the plurality of control signals provided from the row driver 20, the pixel array 10 may be driven by row units.

According to the control of the row driver 20, the pixel array 10 may output a plurality of sensing signals through the plurality of column lines CL.

The ADC circuit 30 may perform analog-digital converting of each of the plurality of sensing signals received through the plurality of column lines CL. The ADC circuit 30 may include an analog-digital converter (hereinafter referred to as ADC) corresponding to each of the plurality of column lines CL, and the ADC may convert the sensing signal received through the corresponding column line CL to a pixel value. According to the operation mode of the image sensor 1, the pixel value may indicate the amount of light sensed by the plurality of pixels P11 to PMN.

The ADC may include a correlated double sampling (CDS) circuit for sampling and holding the received signals. The CDS circuit may perform double sampling of noise signals and sensing signals when the plurality of pixels P11 to PMN are in a reset state, and may output signals corresponding to a difference between the sensing signals and the noise signals. The ADC may include a counter, and the counter may count the signals received from the CDS circuit to generate the pixel value. For example, the CDS circuit may be implemented as an operational transconductance amplifier (OTA), a differential amplifier, etc. The counter may be implemented as, for example, an up-counter and an operation circuit, an up/down counter and a bit-wise inversion counter, etc.

The timing controller 40 may generate timing control signals that control the operation of the row driver 20 and the ADC circuit 30. The row driver 20 and the ADC circuit 30 may drive the pixel array 10 in row units as described above based on the timing control signals from the timing controller 40, and the ADC circuit 30 may convert the plurality of sensing signals received through the plurality of column lines CL into a pixel value.

The image signal processor 50 may receive first image data IDT1, for example, unprocessed image data, from the ADC circuit 30, and perform signal processing of the first image data IDT1. The image signal processor 50 may perform signal processing such as black level rewards, lens shading rewards, cross-talk rewards, and bad pixel corrections.

Second image data IDT2 output from the image signal processor 50, for example, signal processed image data, may be transmitted to a processor 60. The processor 60 may be a host processor of an electronic device to which the image sensor 1 is mounted.

Figure 2:
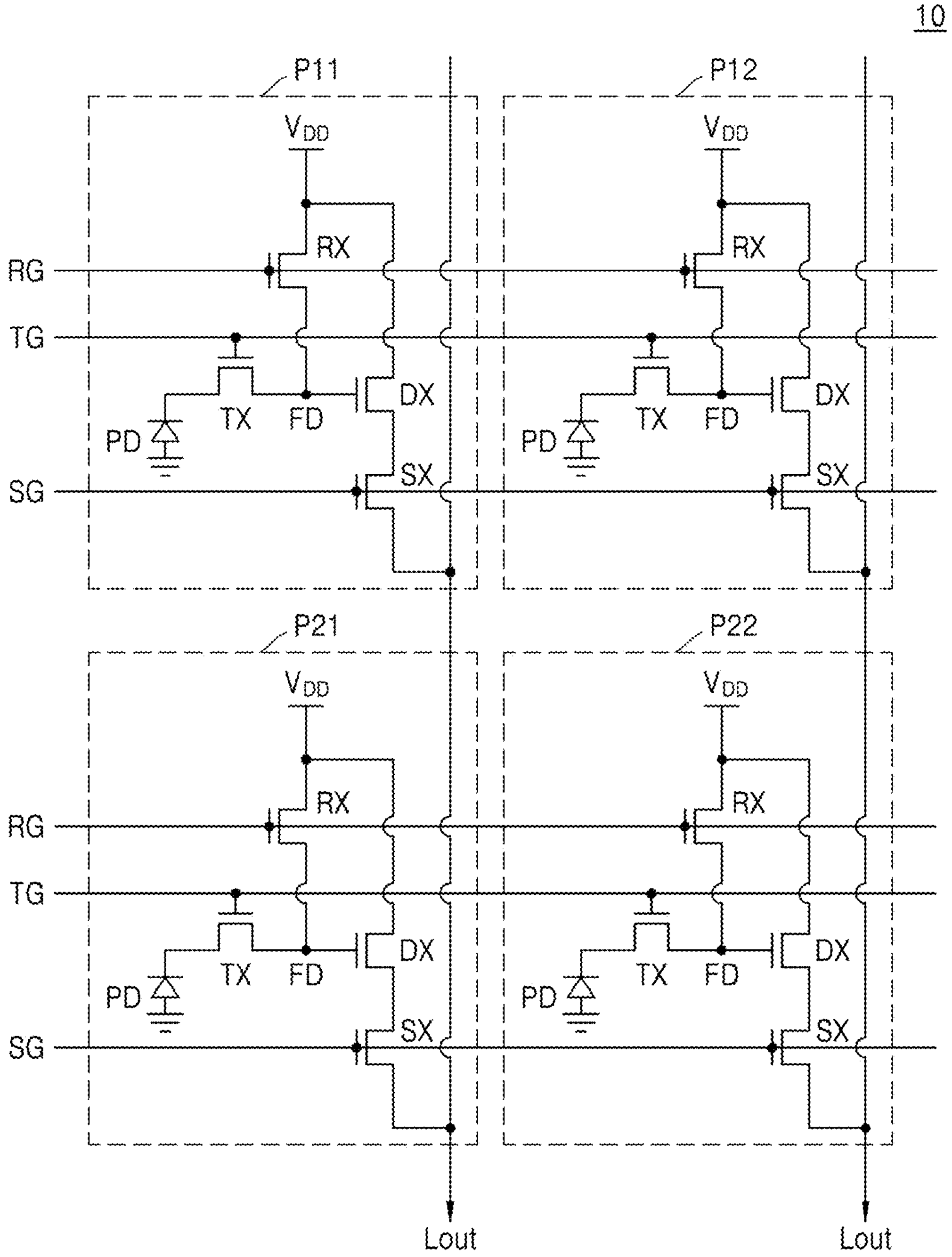
FIG. 2 is a circuit diagram illustrating pixels included in the image sensor according to some example embodiments.

FIG. 2 is a circuit diagram illustrating the pixels included in the image sensor according to various example embodiments.

Referring to FIGS. 1 and 2, the pixel array 10 may include a plurality of pixels P11, P12, P21, and P22. The pixels P11, P12, P21, and P22 may be arranged in the form of a matrix. For convenience of illustrating, only four pixels P11, P12, P21, and P22 are shown in FIG. 2, but the description thereof be similarly applied to each of the plurality of pixels P11 to PMN included in the pixel array 10.

According to various example embodiments, each of the pixels P11, P12, P21, and P22 may include a transmission transistor TX and logic transistors RX, SX, and DX. Here, the logic transistors may include a reset transistors RX, a selecting transistor SX, and a drive transistor DX.

The photoelectric conversion device PD may generate and accumulate photocharges in proportion to the amount of light incident from the outside. The photoelectric conversion device PD may be a photo-sensing device consisting of or including an inorganic photodiode, an organic photodiode, a perovskite photodiode, a photo transistor, a photo gate or a pinned photodiode, and an organic light conductive layer.

A transmission gate TG may transmit charges accumulated in the photoelectric conversion device based on a transmission signal to a floating diffusion region FD. The photocharges generated by the photoelectric conversion device PD may be stored in the floating diffusion region FD. The drive transistor DX may be controlled by the amount of the photocharges accumulated in the floating diffusion region FD.

The reset transistor RX may periodically reset the charges accumulated in the floating diffusion region FD based on the reset signal RG. A drain electrode of the reset transistor RX may be connected to the floating diffusion region FD and the source electrode of the reset transistor RX may be connected to a power supply voltage $V_{DD}$. When the reset transistor RX is turned on, the power supply voltage $V_{DD}$ connected to the source electrode of the reset transistor RX may be transmitted to the floating diffusion region FD. Therefore, the charges accumulated in the floating diffusion region FD may be discharged when the reset transistor RX is turned on and thus the floating diffusion region FD may be reset.

The drive transistor DX may constitute a source follower buffer amplifier together with a constant current source located outside each of the pixels P11, P12, P21, and P22, and may amplify a potential change in the floating diffusion region FD and output the potential change to an output line Lout.

The selecting transistor SX may select the pixels P11, P12, P21, and P22 to read photoelectric signal values sensed in row units based on a selection signal SG. When the selecting transistor SX is turned on, the power supply voltage $V_{DD}$ may be transmitted to the source electrode of the drive transistor DX.

Figure 3:
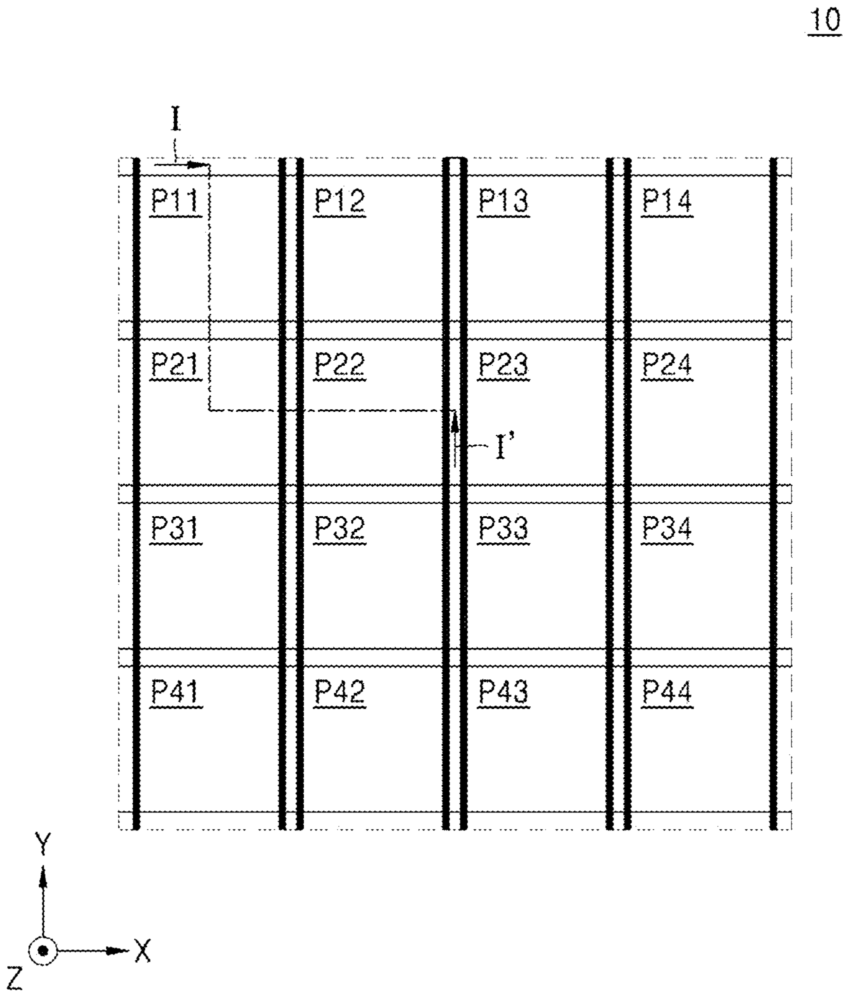
FIG. 3 is a layout of a pixel array of the image sensor according to various example embodiments.
Figure 4:
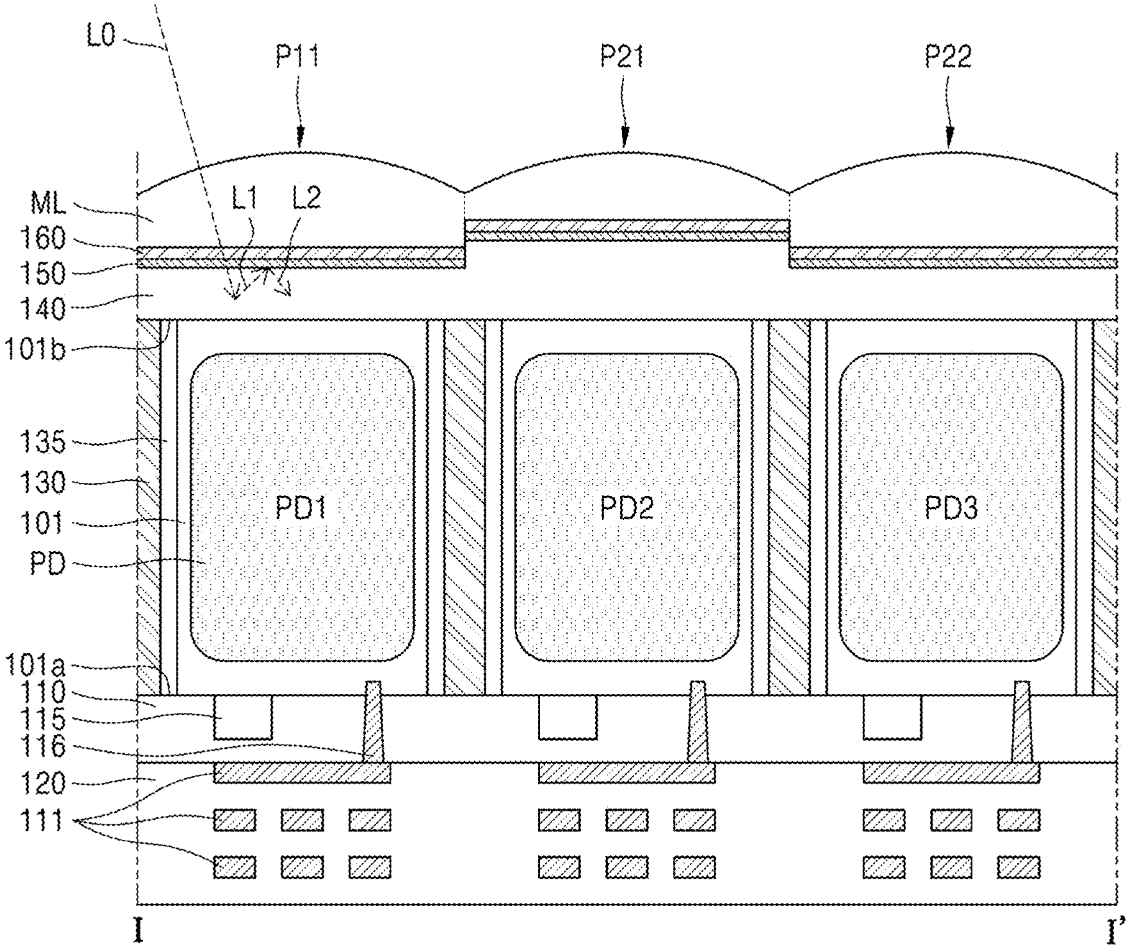
FIG. 4 is a cross-sectional view of a region of the pixel array taken along line I-I' shown in FIG. 3.

FIG. 3 shows a layout of the pixel array of the image sensor according to various example embodiments. FIG. 4 is a cross-sectional view of a region of the pixel array taken along line I-I' shown in FIG. 3.

Referring to FIGS. 3 and 4, the pixel array 10 of the image sensor 1 (refer to FIG. 1) may include a substrate 101, a plurality of photoelectric conversion devices PD, a gate electrode 115, an insulating layer 110, a contact via 116, conductive patterns 111, an interlayer insulating layer 120, first and second device isolation layers 130 and 135, a color filter 140, a reflective absorption layer 150, an anti-reflective layer 160, a planarization layer (not shown), and micro-lenses ML. As shown, each of the pixels (e.g., P11, P21, and P22 as shown in FIG. 4) may include a separate photoelectric conversion device PD and may be defined in the X and Y directions by the first and second device isolation layers 130 and 135. In some example embodiments, pixels may each be defined in the Z direction by the first and second surfaces 101*a* and 101*b* of the substrate 101. In some example embodiments, pixels may each be understood to include any portion of the substrate 101, color filter 140, reflective absorption layer 150, anti-reflective layer 160, planarization layer (not shown), micro-lenses ML, photoelectric conversion device PD, insulating layer 110, interlayer insulating layer 120, or any combination thereof that is between adjacent portions of the first device isolation layer in the X and/or Y directions. For example, in some example embodiments, each pixel may each be understood to include any portion of the substrate 101, color filter 140, reflective absorption layer 150, anti-reflective layer 160, planarization layer (not shown), micro-lenses ML, insulating layer 110, interlayer insulating layer 120, or any combination thereof that overlaps a separate photoelectric conversion device PD in the Z direction.

The substrate 101 may include a first surface 101*a* and a second surface 101*b* facing each other (e.g., opposite surfaces). The first surface 101*a* of the substrate 101 may be the front surface of the substrate 101, and the second surface 101*b* of the substrate 101 may be the rear surface of the substrate 101.

Two directions, which are parallel or substantially parallel to the first surface 101*a* and perpendicular or substantially perpendicular to each other are defined as X and Y directions, and a direction perpendicular or substantially perpendicular to the first surface 101*a* is defined as a Z direction. The X direction, the Y direction, and the Z direction may be perpendicular to each other. In some example embodiments, one of the X direction or the Y direction may be referred to as a first direction, the other one of the X direction or the Y direction may be referred to as a second direction, and the Z direction may be referred to as a third direction or a vertical direction.

In some example embodiments, one of the X direction or the Y direction may be referred to as a first direction, the Z direction may be referred to as a second direction or a vertical direction, and the other one of the X direction or the Y direction may be referred to as a third direction.

A plurality of pixels P11, P12, P13, P14, P21, P22, P23, P24, P31, P32, P33, P34, P41, P42, P43, and P44 (hereinafter referred to as P11 to P44) may be formed in the substrate 101. The plurality of pixels P11 to P44 may be arranged in the form of a matrix in a plan surface. For example, the plurality of pixels P11 to P44 may define a matrix (e.g., array) of pixels.

A plurality of dummy pixels may be formed in the substrate 101. According to various example embodiments, the plurality of pixels P11 to P44 may be arranged in the center of the matrix, and dummy pixels may be arranged in the edge of the matrix.

According to various example embodiments, the first device isolation layer 130 may extend in the X and Y directions between the plurality of pixels P11 to P44 and horizontally separate the plurality of pixels P11 to P44. According to various example embodiments, the second device isolation layer 135 may be arranged between the first device isolation layer 130 and the pixels P11 to P44.

The first device isolation layer 130 may include a polysilicon (poly-Si), for example, a material having excellent gap-fill performance. According to various example embodiments, the first device isolation layer 130 may be doped with a p-type dopant, such as boron (B), but is not limited thereto. According to some example embodiments, the first device isolation layer 130 may have substantially the same length with that of the substrate 101 in the Z direction to separate the plurality of pixels P11 to P44 and the dummy pixels, all of which are different from one another.

The second device isolation layer 135 may include an insulating material. According to various example embodiments, the second device isolation layer 135 may include a material of high dielectric constant, but is not limited thereto.

Here, the substrate 101 and the first device isolation layer 130 may operate as an electrode and the second device isolation layer 135 may operate as a dielectric layer, thereby forming a kind of capacitor. Accordingly, a voltage difference between the substrate 101 and the first device isolation layer 130 may be maintained constant or substantially constant.

According to various example embodiments, a predetermined potential may be applied to the substrate 101 through the contact via 116. According to some example embodiments, the potential of the substrate 101 may be a ground potential, but is not limited thereto. According to various example embodiments, an electric potential that is different from the electric potential applied to the substrate 101 may be applied to the first device isolation layer 130. According to some example embodiments, because the first device isolation layer 130 is a doped polysilicon, the first device isolation layer 130 may entirely have the same or substantially the same electric potential.

According to various example embodiments, by applying a lower voltage than a voltage applied to the substrate 101 to the first device isolation layer 130 (e.g., based on applying a first voltage to the substrate 101 and applying a second voltage to the first device isolation layer 130, where the second voltage is smaller in magnitude than the first voltage), an energy barrier between the first device isolation layer 130 and the substrate 101 may be increased to reduce dark current. Accordingly, the reliability of the image sensor 1 may be improved.

According to various example embodiments, the plurality of photoelectric conversion devices PD, such as photodiodes, may be formed in the substrate 101. The gate electrodes 115 of separate, respective pixels (e.g., P11, P21, P22) may be spaced apart from each other (e.g., in the X direction and/or Y direction) on (e.g., directly on) the first surface 101*a* of the substrate 101. Each gate electrode 115 may be, for example, the gate electrode of the transmission transistor TX, the gate electrode of the reset transistor RX, and the gate electrode of the drive transistor DX of a given pixel PX, for example as shown in FIG. 2.

In FIG. 4, the gate electrodes 115 are shown to be arranged on the first surface 101*a* of the substrate 101, but example embodiments are not limited thereto. For example, the gate electrodes 115 may be buried in the substrate 101.

The interlayer insulating layer 120 and the conductive patterns 111 may be arranged on the first surface 101*a* of the substrate 101. The conductive patterns 111 may be covered by the interlayer insulating layer 120. The conductive patterns 111 may be protected and insulated by the interlayer insulating layer 120.

The interlayer insulating layer 120 may include, for example, silicon oxide, silicon nitride, silicon oxynitride, etc. The conductive patterns 111 may include, for example, aluminum (Al), copper (Cu), tungsten (W), cobalt (Co), ruthenium (Ru), etc.

The conductive patterns 111 may include a plurality of stacked wirings at different levels (e.g., different distances from the first surface 101*a* of the substrate 101 in the Z direction). In FIG. 4, the conductive patterns 111 are shown to include three layers of that are sequentially stacked, but example embodiments are not limited thereto. For example, at least two layers or at least four layers of conductive patterns 111 may be formed in the interlayer insulating layer 120.

The insulating layer 110 may be arranged between the first surface 101*a* of the substrate 101 and the interlayer insulating layer 120. The insulating layer 110 may cover the gate electrode 115 arranged on the first surface 101*a* of the substrate 101. According to various example embodiments, the insulating layer 110 may include insulation materials such as silicon oxide, silicon nitride, silicon oxynitride, etc.

The color filter 140 may be arranged on the second surface 101*b* of the substrate 101. The color filter 140 may be configured to transmit light having wavelength bands that are identical to or different from each other to the plurality of pixels P11 to P44. According to various example embodiments, the color filter 140 may have a multi-layer structure in which a high refractive index layer and a low refractive index layer are alternately stacked (e.g., alternately stacked in the Z direction). In addition, according to various example embodiments, the color filter 140 may be configured to form (e.g., establish, define, etc.) a resonance structure. According to various example embodiments, a thickness of the color filter 140 in the Z direction may be in a range of about 100 nm to about 200 nm. According to various example embodiments, the color filter 140 portion overlapping the plurality of pixels P11 to P44 may be the color filter of the plurality of pixels P11 to P44. The color filter 140 is described in detail in FIG. 5.

The reflective absorption layer 150 may be arranged on the color filter 140. The reflective absorption layer 150 may include a thin metal layer. The reflective absorption layer 150 may re-reflect light reflected from the color filter 140 to the micro lenses ML to the color filter 140. For example, as shown in FIG. 4, external light L0 may be received external to the image sensor 1, where such external light L0 is incident to the color filter 140 is reflected by the color filter 140 as reflected light L1 reflected from the color filter 140 toward the micro lenses ML (e.g., in the +Z direction). The reflective absorption layer 150 may reflect such reflected light L1 back toward the color filter 140 (e.g., in the −Z direction) as re-reflected light L2. The reflective absorption layer 150 may have a thickness in the Z direction of 10 nm or less (e.g., about 1 nm to about 10 nm, or the like). The reflective absorption layer 150 may include at least one of tungsten, titanium, or aluminum. The vertical height of the reflective absorption layer 150 in the Z direction may differ according to portions overlapping the plurality of pixels P11 to P44 in the Z direction. For example, as shown in at least FIG. 4, the distance from the second surface 101*b* of the substrate 101 in the Z direction of separate, respective portions of the reflective absorption layer 150 that overlap (or are included in) separate, respective pixels P11 to P44 may be different from each other.

The anti-reflective layer 160 may be or include a transparent insulation layer of an oxide film system. According to some example embodiments, the anti-reflective layer 160 may include hafnium oxide ($HfO_2$), silicon nitride (SiN), aluminum oxide ($Al_2O_3$), zirconium oxide ($ZrO_2$), tantalum oxide ($Ta_2O_5$), titanium oxide ($TiO_2$), lanthanum oxide ($Ta_2O_5$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), lutetium oxide ($Lu_2O_3$), or yttrium oxide ($Y_2O_3$).

The anti-reflective layer 160 may be a single layer consisting of or including any of the above-described materials or may consist of or include multi-layers in which the above-described materials are stacked. For example, the anti-reflective layer 160 may have transmittance to light having a wavelength band of visible rays. For example, the anti-reflective layer 160 may consist of or include a substance having a refractive index of less than 1.5, for example about 0.01 to about 1.5.

The planarization layer may cover the anti-reflective layer 160. The planarization layer may include, for example, an oxide film, a nitride film, a low dielectric material, and a resin. According to various example embodiments, the planarization layer may include a multi-layer structure.

The plurality of micro lenses ML may be arranged on the anti-reflective layer 160. The plurality of micro lenses ML may be made of organic substances such as photosensitive resins, or inorganic substances. The plurality of micro lenses ML may condense incident light in the photoelectric conversion device PD. Each of the plurality of micro lenses ML may vertically overlap separate, respective photoelectric conversion devices PD corresponding to the micro lenses ML among the photoelectric conversion devices PD. Accordingly, one of the micro lenses ML and one of the photoelectric conversion devices PD may be arranged in each of the plurality of pixels P11 to P44 (e.g., included in separate, respective pixels of the plurality of pixels P11 to P44).

Figure 5:
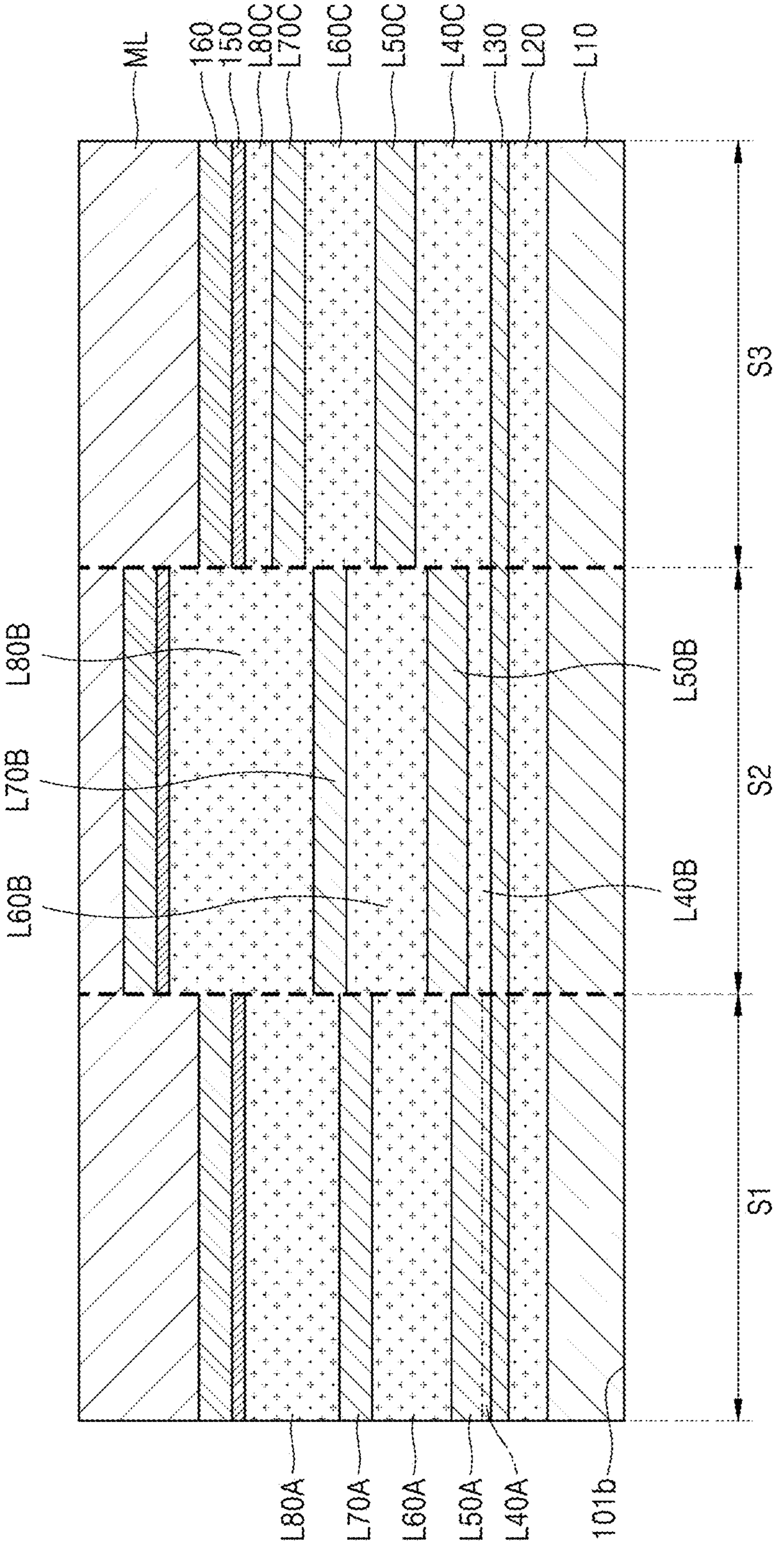
FIG. 5 is a cross-sectional view of a color filter included in the image sensor according to some example embodiments.

FIG. 5 shows a cross-sectional view of a color filter included in the image sensor according to some example embodiments. Below, descriptions are made with reference to FIGS. 1 and 4, and contents already described in relation to FIG. 4 are briefly explained or omitted.

Referring to FIGS. 4 and 5, the color filter 140 may include a plurality of dielectric layers. The plurality of dielectric layers may extend in a first direction (e.g., the X direction of FIG. 3) parallel to the rear surface of the substrate 101, and may have a first width in a second direction (e.g., the Y direction of FIG. 3) parallel to the rear surface of the substrate and perpendicular to the first direction. As shown, the color filter 140 may include multiple regions S1, S2, S3, also referred to herein interchangeably as "portions," that are on (e.g., overlap in the Z direction) separate, respective pixels or photoelectric conversion devices. For example, as shown in FIG. 5, the first region S1 shows a first region of the color filter 140 overlapping a first pixel P11 or a first photoelectric conversion device PD1 in the Z direction, the second region S2 shows a second region of the color filter 140 overlapping a second pixel P21 or a second photoelectric conversion device PD2 in the Z direction, and the third region S3 shows a third region overlapping a third pixel P22 or a third photoelectric conversion device PD3 in the Z direction.

The plurality of dielectric layers may include first to eighth dielectric layers L10 to L80C. The first dielectric layer L10 may be in contact with the second surface 101*b* of the substrate 101. The image sensor 1 of some example embodiments is illustrated to include eight dielectric layers L10 to L80C in which a plurality of dielectric layers are stacked sequentially (e.g., in the Z direction), but may include at least nine or at least ten dielectric layers.

The first to eighth dielectric layers L10 to L80C may be stacked sequentially from the first dielectric layer L10 in the Z direction. The eighth dielectric layers L80A, L80B, and L80C may be arranged under the reflective absorption layer 150 in the Z direction. In addition, the eighth dielectric layer may be in contact with the reflective absorption layer 150. The first to eighth dielectric layers L10 to L80C may form (e.g., establish, define, etc.) a resonance structure.

The first dielectric layer L10, the second dielectric layer L20, and the third dielectric layer L30 may have a constant thickness in a third direction (e.g., the Z direction) perpendicular to the rear surface of the substrate 101. For example, first dielectric layer L10, the second dielectric layer L20, and the third dielectric layer L30 may each have a thickness in the Z direction that is constant along the X and Y directions. That is, the thickness of each the first dielectric layer L10, the second dielectric layer L20, and the third dielectric layer L30 in the third direction may be constant in the first region S1 to the third region S3. The thickness of the first dielectric layer L10 may be greater than the thickness of the second dielectric layer L20. The thickness of the second dielectric layer L20 may be greater than the thickness of the third dielectric layer L30.

A fourth dielectric layer may include a 4-1$^{st}$ dielectric layer L40A in the first region S1, a 4-2$^{nd}$ dielectric layer L40B in the second region S2, and a 4-3$^{rd}$ dielectric layer L40C in the third region S3. The thickness of the fourth dielectric layers L40A, L40B, and L40C (e.g., thickness in the Z direction) may be different in the first region S1 to the third region S3 and thus may vary along the first and/or second directions (e.g., X direction and/or Y directions). For example, a thickness of the 4-3$^{rd}$ dielectric layer L40C may be greater than a thickness of the 4-2$^{nd}$ dielectric layer L40B. In addition, the thickness of the 4-2$^{nd}$ dielectric layer L40B may be greater than a thickness of the 4-1$^{st}$ dielectric layer L40A. In particular, the 4-1$^{st}$ dielectric layer L40A in the first region S1 may be etched as a whole, and the first region S1 may not include the 4-1$^{st}$ dielectric layer L40A, such that the fourth dielectric layer is not on (e.g., does not overlap in the Z direction) a photoelectric conversion device (e.g., PD1 as shown in FIG. 4) and the photoelectric conversion device (e.g., PD1) may be exposed from the fourth dielectric layer in the Z direction.

Fifth dielectric layers L50A, L50B, and L50C (hereinafter, also referred to as fifth-first, fifth-second, and fifth-third dielectric layers L50A, L50B, and L50C), sixth dielectric layers L60A, L60B, and L60C, and seventh dielectric layers L70A, L70B, and L70C may have the same thickness in the third direction perpendicular to the rear surface of the substrate 101. That is, the thickness of each of the fifth dielectric layers L50A, L50B, and L50C, the sixth dielectric layers L60A, L60B, and L60C, and the seventh dielectric layers L70A, L70B, and L70C in the third direction may be constant in the first region S1 to the third region S3.

Because the fifth dielectric layers L50A, L50B, and L50C are arranged on the fourth dielectric layers L40A, L40B, and L40C, respectively, the vertical levels (e.g., distance from the second surface 101*b* of the substrate 101 in the Z direction) of the fifth dielectric layers L50A, L50B, and L50C in the third direction may be different from each other. For example, the vertical level in the third direction of the fifth-first dielectric layer L50A of the first region S1 may be less than the vertical level in the third direction of the fifth-second dielectric layer L50B of the second region S2. In addition, the vertical level in the third direction of the fifth-second dielectric layer L50B of the second region S2 may be less than vertical level in the third direction of the fifth-third dielectric layer L50C of the third region S3. The same may apply to the sixth dielectric layers L60A, L60B, and L60C and the seventh dielectric layers L70*a*, L70*b*, and L70C.

The eighth dielectric layers L80A, L80B, and L80C may include a 8-1$^{st}$ dielectric layer L80A in the first region S1, a 8-2$^{nd}$ dielectric layer L80B in the second region S2, and a 8-3$^{rd}$ dielectric layer L80C in the third region S3. The thickness of the eighth dielectric layers L80A, L80B, and L80C may be different in the first region S1 to the third region S3. For example, the thickness of the 8-2$^{nd}$ dielectric layer L80B may be greater than the thickness of the 8-1$^{st}$ dielectric layer L80A. In addition, the thickness of the 8-1$^{st}$ dielectric layer L80A may be greater than the thickness of the 8-3$^{rd}$ dielectric layer L80C.

By making the thickness (e.g., in the Z direction) of the fourth dielectric layers L40A, L40B, and L40C different (including example embodiments where layer L40A is completely omitted) and by making the thickness of the eighth dielectric layers L80A, L80B, and L80C different from each other, the color filter 140 may have a thickness in the third direction (e.g., the Z direction) that varies along a direction parallel to the second surface 101*b* of the substrate 101 (e.g., the X direction and/or the Y direction), such that different portions (e.g., regions) of the color filter 140 may have separate, respective, different thicknesses that may correspond to (e.g., overlap in the Z direction) separate, respective pixels and/or photoelectric conversion devices PD.

By making the thickness of the fourth dielectric layers L40A, L40B, and L40C and the eighth dielectric layers L80A, L80B, and L80C different, for example such that the color filter 140 may have multiple portions having different thicknesses that may correspond to (e.g., overlap in the Z direction) separate, respective pixels and/or photoelectric conversion devices PD, the color filter 140 of the inventive concepts may form (e.g., establish or define) a filter for different visible rays (e.g., a filter configured to selectively transmit and/or block different wavelength bands in different regions of the filter), for example such that the color filter 140 may be configured to selectively transmit and/or block (e.g., may be configured to filter) different wavelength bands of the same external (e.g., incident) light to propagate to different photoelectric conversion devices PD in the Z direction based on the respective thickness(es) of a corresponding region (portion) of the color filter 140 that is on and/or overlaps with the given photoelectric conversion devices.

For example, in some example embodiments, the plurality of dielectric layers L10, L20, L30, L50A, L60A, L70A, L80A on the first photoelectric conversion device PD1 may be (e.g., may define) a portion (e.g., first portion defined in region S1) of the color filter 140 that is configured to act as a blue filter that overlaps the first photoelectric conversion device PD1 in the Z direction and which is configured to, in response to receiving external light which is incident to the color filter 140 and includes visible blue, green, and red rays (e.g., light in the green, blue, and red wavelength bands) selectively transmit visible blue rays of the external light (e.g., light in the blue wavelength band) and selectively block visible green rays and visible red rays of the external light (e.g., light in the green and red wavelength bands) from propagating through the color filter 140 (e.g., the first portion defined in region S1) to the first photoelectric conversion device PD1. For example, the first region S1 of the color filter 140 may define a blue filter based on the respective thicknesses of the plurality of dielectric layers L10, L20, L30, L50A, L60A, L70A, L80A of the first region S1 of the color filter 140.

In another example, in some example embodiments, the plurality of dielectric layers L10, L20, L30, L40B, L50B, L60B, L70B, L80B on the second photoelectric conversion device PD2 may be (e.g., may define) a portion (e.g., second portion defined in region S2) of the color filter 140 that is configured to act as a green filter that overlaps the second photoelectric conversion device PD2 in the Z direction and which is configured to, in response to receiving external light which is incident to the color filter 140 and includes visible blue, green, and red rays (e.g., light in the green, blue, and red wavelength bands) selectively transmit visible green rays of the external light (e.g., light in the green wavelength band) and selectively block visible blue rays and visible red rays of the external light (e.g., light in the blue and red wavelength bands) from propagating through the color filter 140 (e.g., the second portion defined in region S2) to the second photoelectric conversion device PD2. For example, the second region S2 of the color filter 140 may define a green filter based on the respective thicknesses of the plurality of dielectric layers L10, L20, L30, L40B, L50B, L60B, L70B, L80B of the second region S2 of the color filter 140.

In some example embodiments, the plurality of dielectric layers L10, L20, L30, L40C, L50C, L60C, L70C, L80C on the third photoelectric conversion device PD3 may be (e.g., may define) a portion (e.g., third portion defined in region S3) of the color filter 140 that is configured to act as a red filter that overlaps the third photoelectric conversion device PD3 in the Z direction and which is configured to, in response to receiving external light which is incident to the color filter 140 and includes visible blue, green, and red rays (e.g., light in the green, blue, and red wavelength bands) selectively transmit visible red rays of the external light (e.g., light in the red wavelength band) and selectively block visible blue rays and visible green rays of the external light (e.g., light in the blue and green wavelength bands) from propagating through the color filter 140 (e.g., the third portion defined in region S3) to the third photoelectric conversion device PD3. For example, the third region S3 of the color filter 140 may define a red filter based on the respective thicknesses of the plurality of dielectric layers L10, L20, L30, L40C, L50C, L60C, L70C, L80C of the second region S3 of the color filter 140.

The color filter 140 may thus be configured to define various different portions that define different filters (e.g., red filters, green filters, blue filters, etc.) on (e.g., overlapping in the Z direction) separate, respective photoelectric conversion devices PD of separate, respective pixels and thus may be configured to cause the separate respective pixels to be configured to sense different wavelength bands of the same incident light (e.g., external light including light in the green, blue, and red wavelength bands) received at the color filter 140 based on the color filter 140 selectively transmitting different wavelength bands of the received external light to different photoelectric conversion devices PD based on different dielectric layers and/or thicknesses thereof of corresponding portions (e.g., of regions S1, S2, S3, etc.) of the color filter 140 overlapping the different photoelectric conversion devices PD in the Z direction.

Accordingly, it will be understood that the color filter 140 may be configured to define multiple, different color filters (e.g., as defined by the separate portions of the color filter 140 in regions S1, S2, and S3) on (e.g., overlapping in the Z direction) different photoelectric conversion devices PD1, PD2, and PD3, and thus may be configured to selectively transmit (and selectively block) different wavelength bands of a same external light to the different photoelectric conversion devices, based on the color filter 140 including a plurality of dielectric layers having varying thicknesses along the X and/or Y directions to thus have varying thicknesses in the different portions of the color filter 140 that overlap the different photoelectric conversion devices, based on at least one dielectric layer of the plurality of dielectric layers (e.g., L40, comprising at least L40B and L40C, and/or L80, comprising L80A, L80B, and L80C)

having a thickness in the Z direction that varies along the X direction and/or the Y direction.

The first dielectric layer L10, the third dielectric layer L30, the fifth dielectric layers L50A, L50B, and L50C, and the seventh dielectric layers L70A, L70B, and L70C may consist of or include negatively charged substances. The first dielectric layer L10, the third dielectric layer L30, the fifth dielectric layers L50A, L50B, and L50C, and the seventh dielectric layers L70A, L70B, and L70C may include at least one of titanium oxide ($TiO_x$), tin oxide ($SnO_x$), zirconium oxide ($ZrO_x$), tantalum oxide ($TaO_x$), molybdenum oxide ($MoO_x$), niobium oxide ($NbO_x$), aluminum nitride ($AlN_x$), gallium nitride ($GaN_x$), boron nitride ($BN_x$), silicon nitride ($SiN_x$), or silicon carbide ($SiC_x$). In addition, the first dielectric layer L10, the third dielectric layer L30, the fifth dielectric layers L50A, L50B, and L50C, and the seventh dielectric layers L70A, L70B, and L70C may consist of or include substances having a refractive index of about 2 or more. That is, the first dielectric layer L10, the third dielectric layer L30, the fifth dielectric layers L50A, L50B, and L50C, and the seventh dielectric layers L70A, L70B, and L70C may consist of or include substances having a refractive index of about 2 or more.

The second dielectric layer L20, the fourth dielectric layers L40A, L40B, and L40C, the sixth dielectric layers L60A, L60B, and L60C, and the eighth dielectric layers L80A, L80B, and L80C may have transmittance in visible ray wavelengths. The second dielectric layer L20, the fourth dielectric layers L40A, L40B, and L40C, the sixth dielectric layers L60A, L60B, and L60C) and the eighth dielectric layers L80A, L80B, and L80C may consist of or include substances having a refractive index of less than about 1.5 (e.g., about 0.01 to about 1.5). That is, the second dielectric layer L20, the fourth dielectric layers L40A, L40B, and L40C, the sixth dielectric layers L60A, L60B, and L60C, and the eighth dielectric layers L80A, L80B, and L80C may be dielectric layers having relatively low refractive indices among the plurality of dielectric layers. In some example embodiments, the second dielectric layer L20, the fourth dielectric layers L40A, L40B, and L40C, the sixth dielectric layers L60A, L60B, and L60C, and the eighth dielectric layers L80A, L80B, and L80C may include at least one of silicon oxide ($SiO_x$), silicon carbon oxide ($SiO_xC_y$), magnesium fluoride ($MgF_x$), aluminum fluoride ($AlF_x$), or barium fluoride ($BaF_x$).

In this way, the color filter 140 may be formed as a dielectric layer rather than a pigment color filter, and thus a manufacturing process to manufacture the image sensor that includes a process temperature of 200 degrees or more without damaging the color filter 140 may be possible. In addition, by forming an image sensor 1 to include the color filter 140 and the reflective absorption layer 150, a flare phenomenon due to the relatively high reflection of light in a certain wavelength range, which may occur in a conventional image sensor employing inorganic material-based color filter, may be reduced, minimized, or prevented, thereby improving operational performance of the image sensor 1. Accordingly, the stability of the image sensor and the resolution may be improved.

Figure 6:
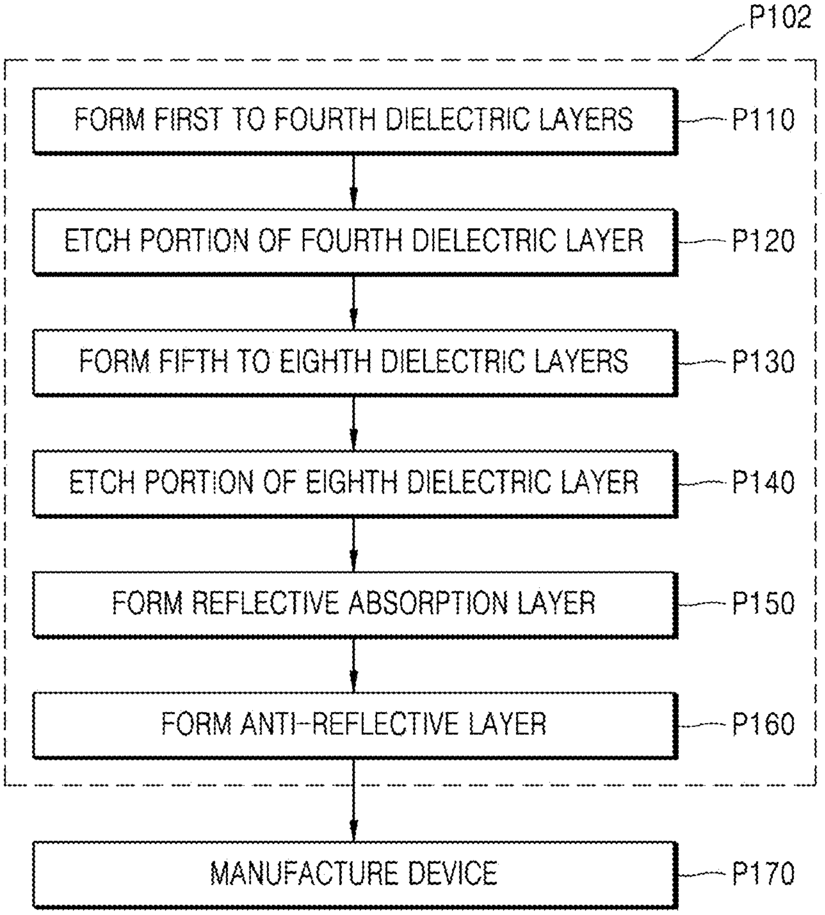
FIG. 6 is a flowchart illustrating a method of manufacturing the image sensor according to some example embodiments.

FIG. 6 is a flowchart illustrating a method that may include a method of manufacturing an image sensor according to some example embodiments. FIGS. 7A, 7B, 7C, 7D, 7E, 7F, and 7G are cross-sectional views for explaining a method of manufacturing an image sensor according to various example embodiments. Below, descriptions are made with reference to FIGS. 1 and 4, and contents already described in relation to FIGS. 1 to 5 are briefly explained or omitted. As shown in FIG. 6, the method of manufacturing the image sensor may be performed at P102.

Figure 7A:
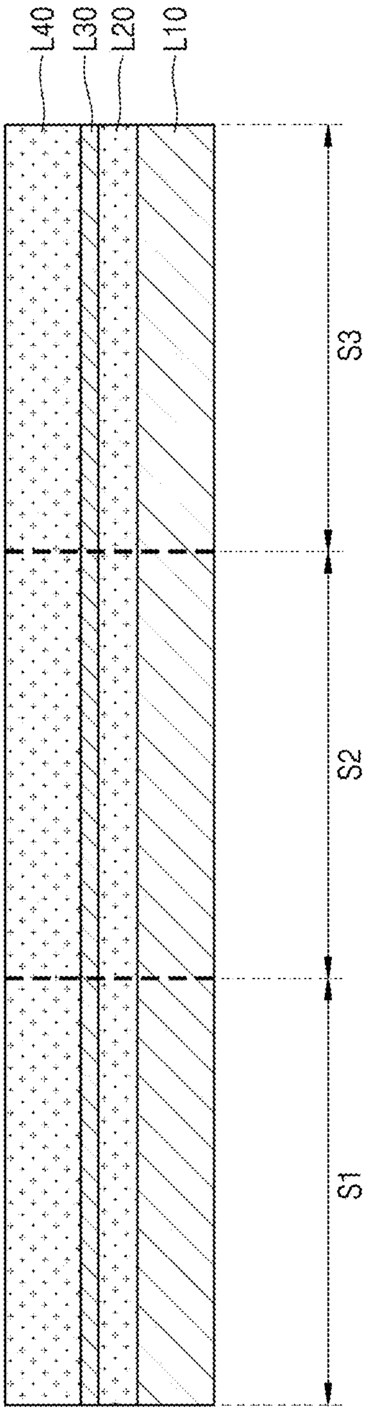
FIGS. 7A, 7B, 7C, 7D, 7E, 7F, and 7G are cross-sectional views for explaining a method of manufacturing the image sensor according to various example embodiments.

Referring to FIGS. 6 and 7A, in the method of manufacturing the image sensor 1 of some example embodiments, first to fourth dielectric layers L10, L20, L30, and L40 may be formed at P110. The first to fourth dielectric layers L10, L20, L30, and L40 may be stacked sequentially on the substrate 101 from the first dielectric layer L10. The thickness of each of the first to fourth dielectric layers L10, L20, L30, and L40 in the third direction (e.g., the Z direction of FIG. 3) may be constant (e.g., fixed across the first and/or second directions parallel to the second surface 101*b* of the substrate 101).

Figure 7B:
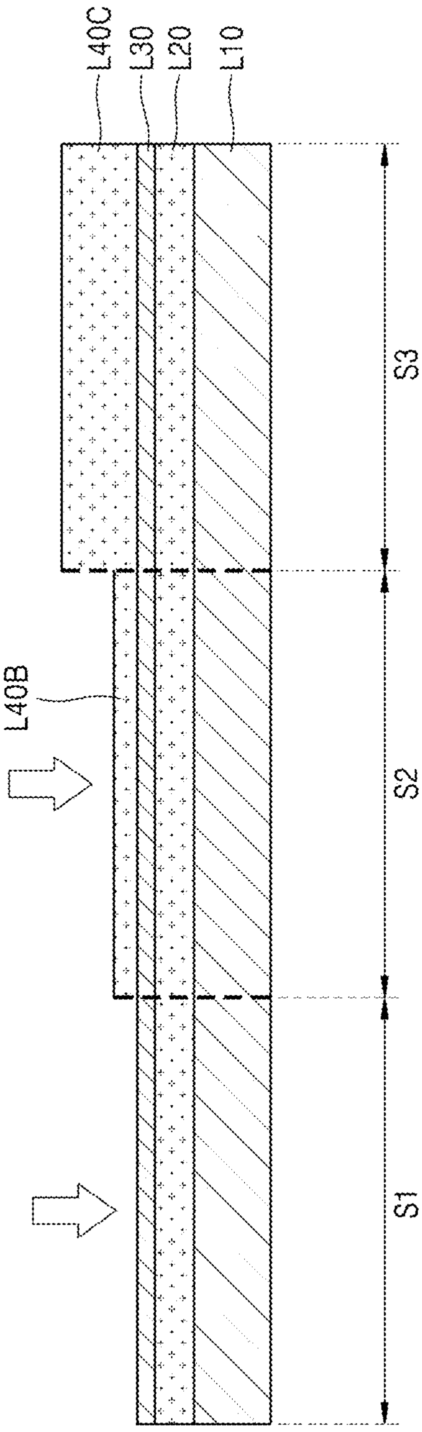

Referring to FIGS. 6, 7A, and 7B, after forming first to fourth dielectric layers L10, L20, L30, and L40, a portion of the fourth dielectric layer L40 of FIG. 7A may be etched at P120. For example, the first region S1 and the second region S2 of the fourth dielectric layer L40 may be etched. The first region S1 may not include the fourth dielectric layer L40 by etching the fourth dielectric layer L40 in the first region S1. In addition, the 4-2$^{nd}$ dielectric layer L40B may be formed by etching the fourth dielectric layer L40 in the second region S2. Since the fourth dielectric layer L40 in the third region S3 is not etched, the fourth dielectric layer L40 in the third region S3 may be the 4-3$^{rd}$ dielectric layer L40C.

Figure 7C:
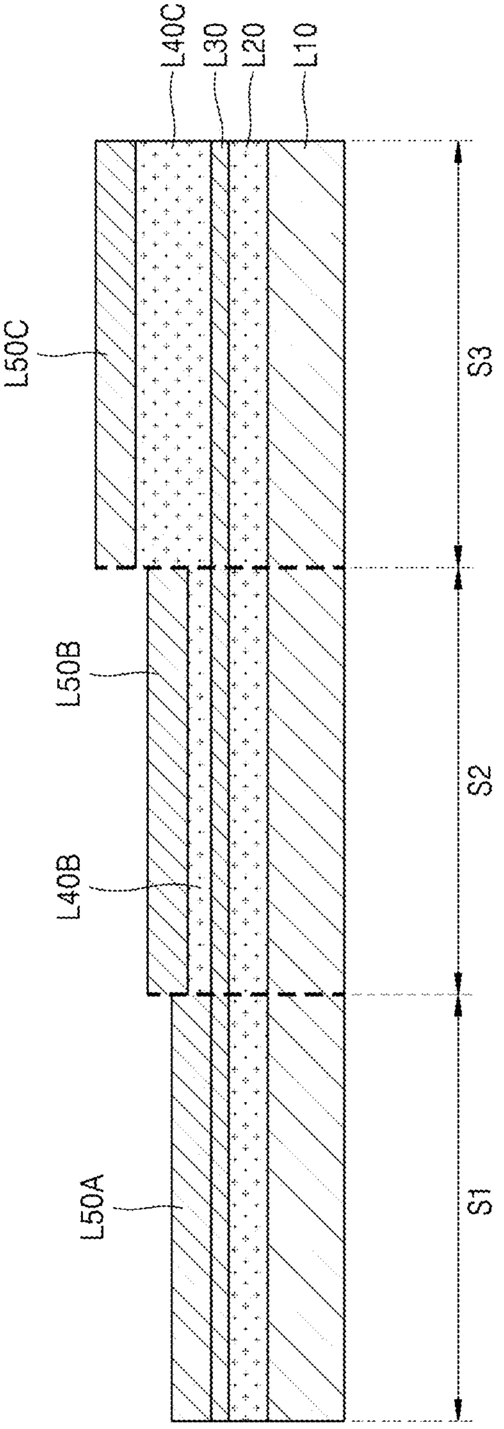
Figure 7D:
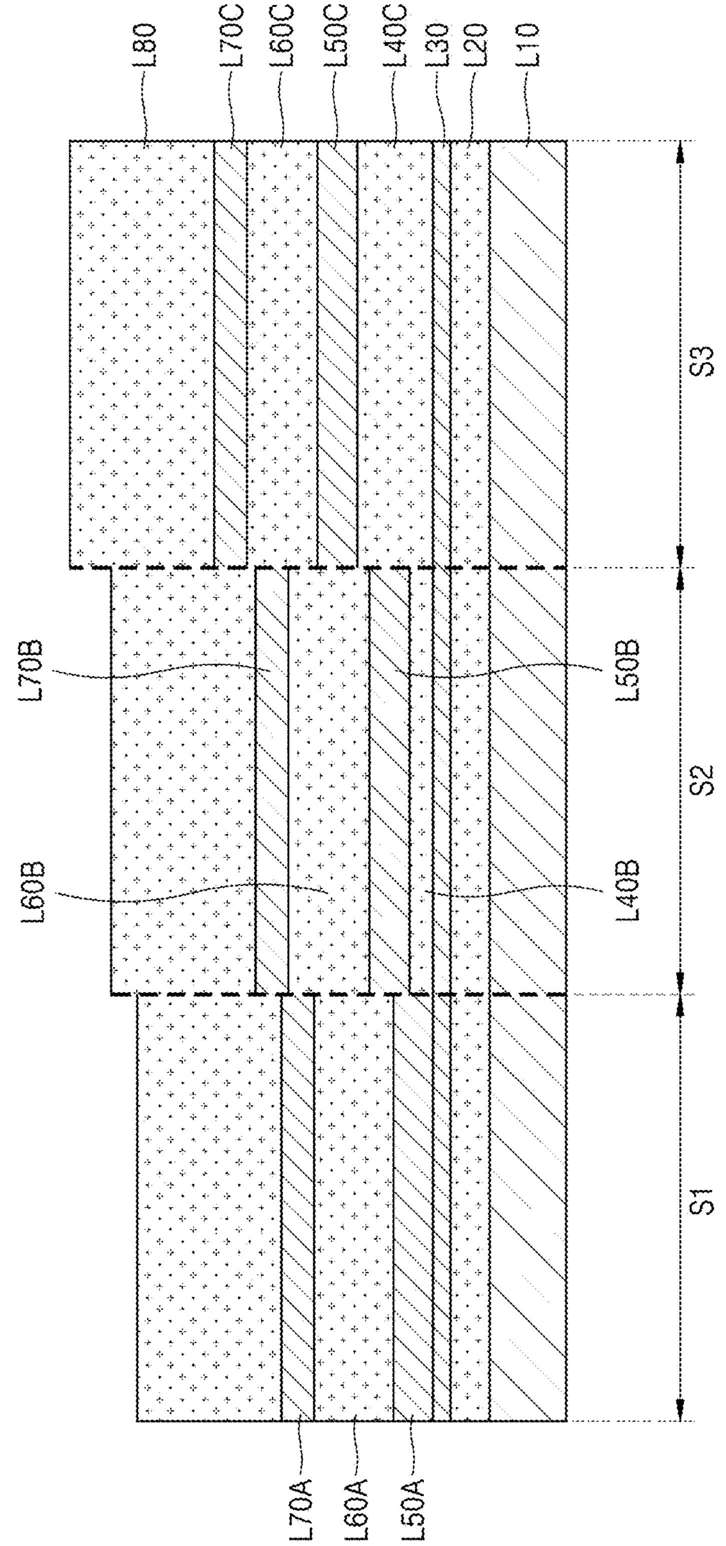

Referring to FIGS. 6, 7C, and 7D, after etching a portion of the fourth dielectric layer L40, the fifth to eighth dielectric layers L50A, L50B, L50C, L60A, L60B, L60C, L70A, L70B, L70C, and L80 may be formed at P130. The fifth to eighth dielectric layers L50A, L50B, L50C, L60A, L60B, L60C, L70A, L70B, L70C, and L80 may be sequentially stacked on the third dielectric layer L30 of the first region S1, and the fourth dielectric layers L40B and L40C of the second and third regions S2 and S3. The thickness of each of the fifth to eighth dielectric layers L50A, L50B, L50C, L60A, L60B, L60C, L70A, L70B, L70C, and L80 in the third direction may be constant.

Because the vertical height of the third dielectric layer L30 of the first region S1 and the fourth dielectric layers L40B and L40C of the second and third regions S2 and S3 in the third direction are different from each other, the vertical heights of each of the fifth to eighth dielectric layers L50A, L50B, L50C, L60A, L60B, L60C, L70A, L70B, L70C, and L80 in the first region S1, the second region S2, and the third region S3 may be different from each other. For example, the vertical heights of each of the fifth to eighth dielectric layers L50A, L50B, L50C, L60A, L60B, L60C, L70A, L70B, L70C, and L80 may be greater in the order of the third region S3, the second region S2, and the first region S1.

Figure 7E:
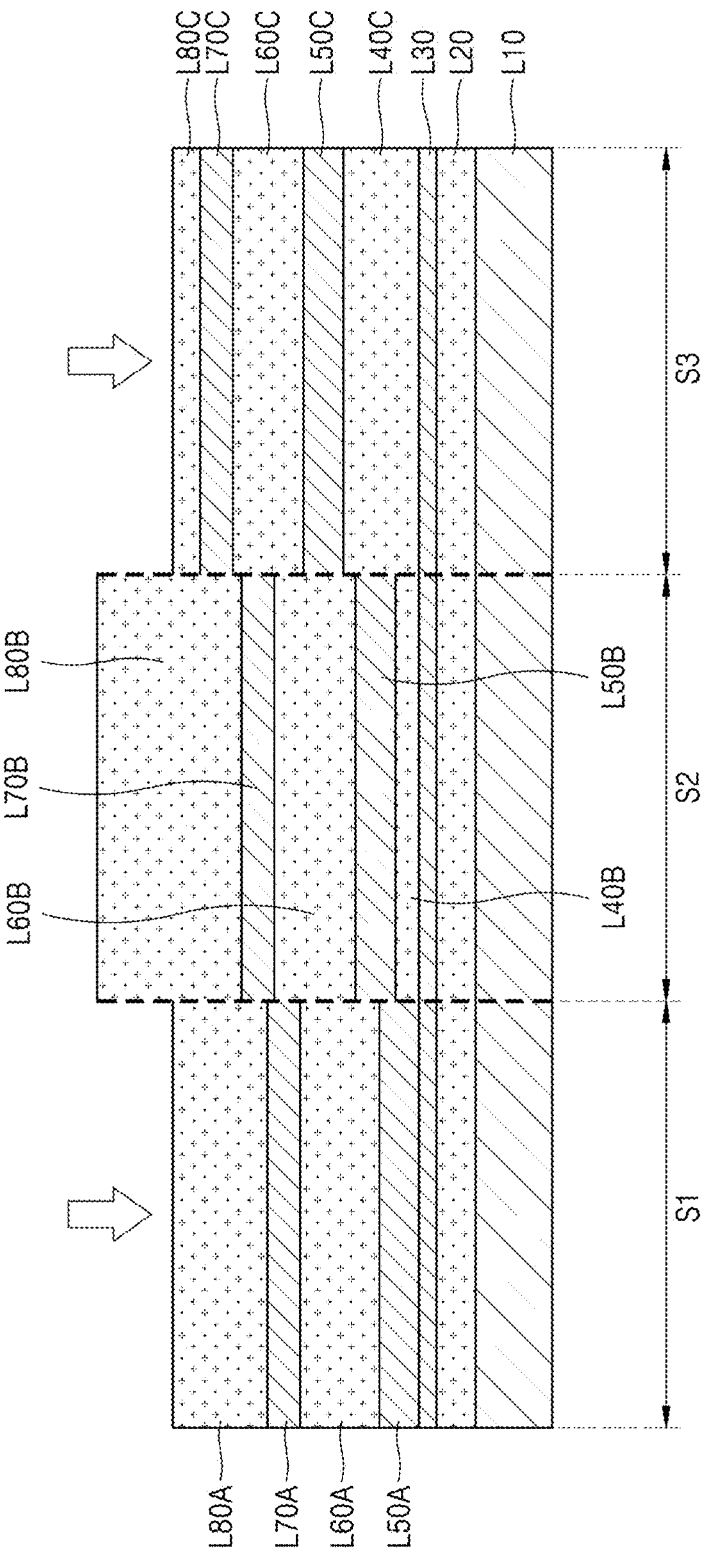

Referring to FIGS. 6 and 7E, after forming the fifth to eighth dielectric layers L50A, L50B, L50C, L60A, L60B, L60C, L70A, L70B, L70C, and L80, a portion of the eighth dielectric layer L80 may be etched at P140. For example, the first region S1 and the third region S3 of the eighth dielectric layer L80 may be etched. The eighth dielectric layer L80 may be etched once or multiple times. When the etching is performed once, the etching process may be performed to etch the third region S3 more than the first region S1. When the etching is performed multiple times, in a first etching, the first region S1 and the third region S3 may be etched in the same depth in the third direction. Next, in a second etching, only the third region S3 may be etched in a third direction depth.

The 8-1$^{st}$ dielectric layer L80A may be formed by etching the eighth dielectric layer L80 in the first region S1. In addition, the 8-3$^{rd}$ dielectric layer L80C may be formed by etching the eighth dielectric layer L80 in the third region S3. Since the eighth dielectric layer L80 in the second region S2 is not etched, the eighth dielectric layer L80 in the second region S2 may be the 8-2$^{nd}$ dielectric layer L80B.

Figure 7F:
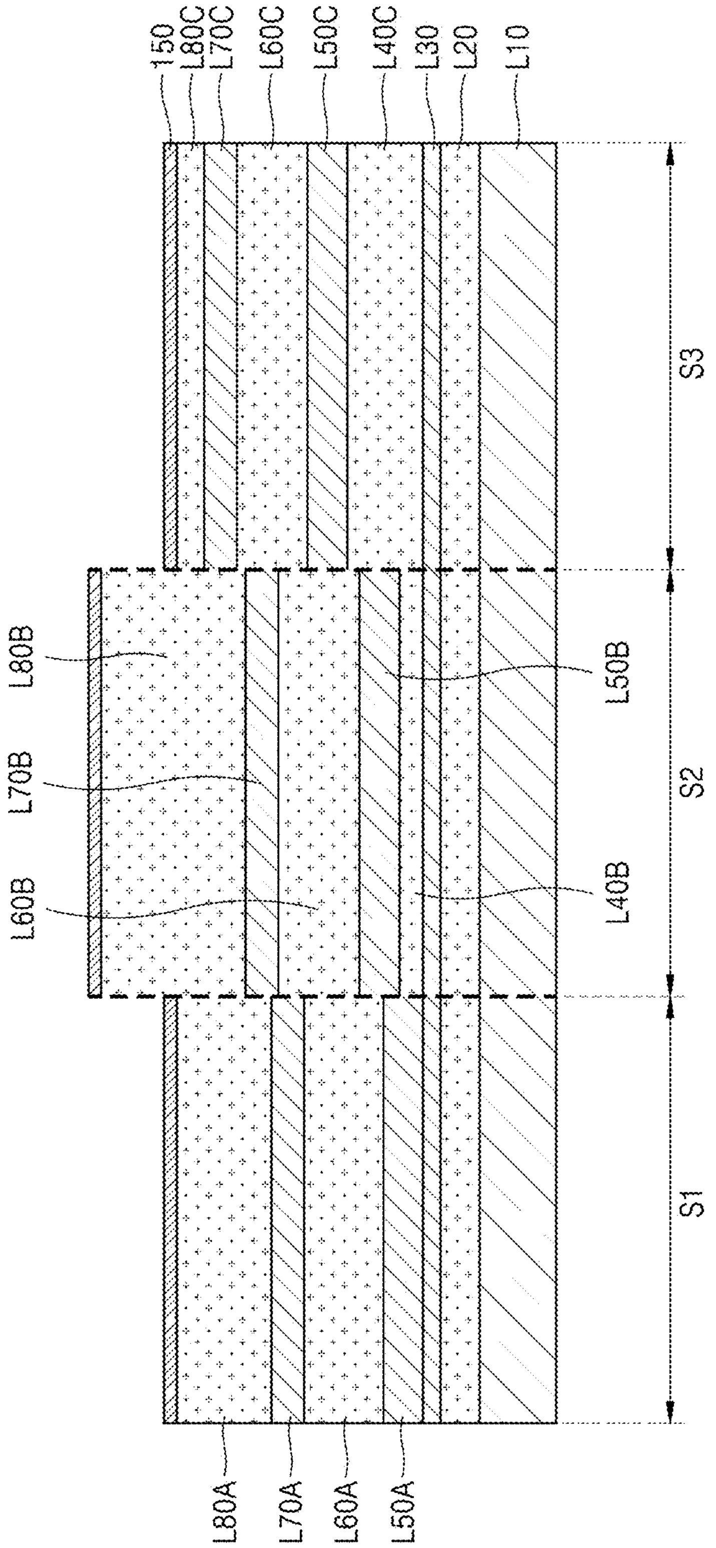
Figure 7G:
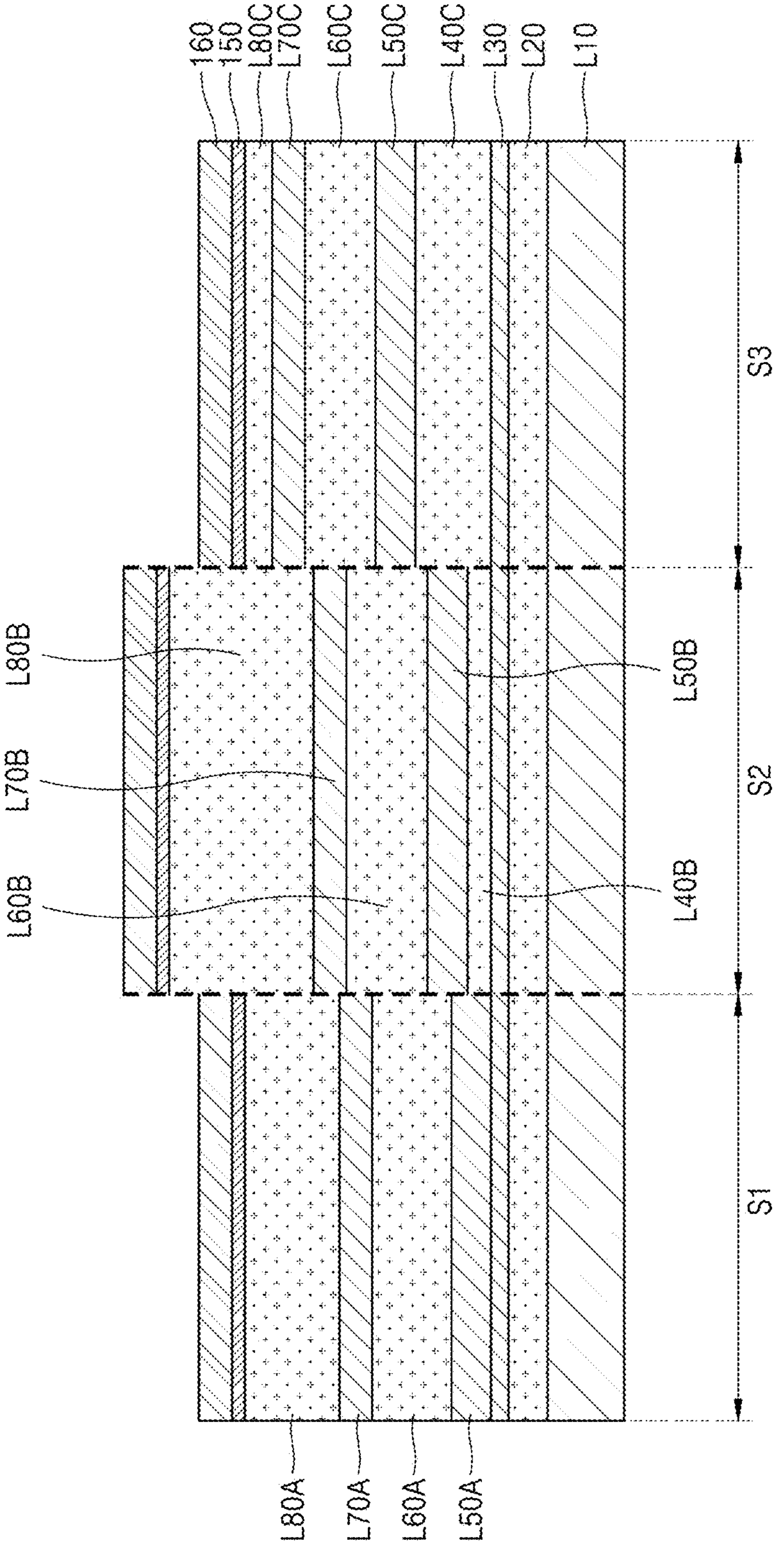

Referring to FIGS. 6, 7F, and 7G, the reflective absorption layer 150 and the anti-reflective layer 160 may be formed on the eighth dielectric layers L80A, L80B, and L80C at P150 and P160, respectively. The reflective absorption layer 150 and the anti-reflective layer 160 may be stacked sequentially on the eighth dielectric layers L80A, L80B, and L80C. The thickness of each of reflective absorption layer 150 and the anti-reflective layer 160 may be constant in the first region S1 to the third region S3. Since each of the reflective absorption layer 150 and the anti-reflective layer 160 are stacked on the eighth dielectric layers L80A, L80*b*, and L80C, the vertical height of each of the reflective absorption layer 150 and the anti-reflective layer 160 may be greater in the order of the second region S2, the first region S1, and the third region S3. Through this manufacturing method, a layer having the same shape as the color filter 140, the reflective absorption layer 150, and the anti-reflective layer 160 of FIGS. 4 and 5 may be formed.

In addition, although not shown in the drawing, after operation P160, a process of forming a grid that separates the reflective absorption layer 150 and the anti-reflective layer 160 may be performed. The grid may be formed of a material having a lower refractive index than that of the material used in the plurality of dielectric layers.

Although not shown in the drawing, according to some example embodiments, the method of manufacturing the image sensor 1 may include, after forming first to fourth dielectric layers, performing a first etching process to etch the fourth dielectric layer of both a first region and a second region. Next, a 4-1$^{st}$ dielectric layer may be formed on the first region and the second region of the third dielectric layer and the third region of the fourth dielectric layer. Subsequently, the 4-1$^{st}$ dielectric layer in the first region may be etched through a second etching process. Here, the first region refers to a dielectric layer corresponding to a blue filter, the second region refers to a dielectric layer corresponding to a green filter, and the third region refers to a dielectric layer corresponding to a red filter.

Next, a fifth to eighth dielectric layers may be formed on the first region of the third dielectric layer and the second and third regions of the 4-1$^{st}$ dielectric layer. The eighth dielectric layer may be etched on the first and third regions of the eighth dielectric layer. Next, a 8-1$^{st}$ dielectric layer may be formed on the first region and the second region of the seventh dielectric layer and the second region of the eighth dielectric layer. Subsequently, the 8-1$^{st}$ dielectric layer may be etched on the third region of the 8-1$^{st}$ dielectric layer. Next, the reflective absorption layer and the anti-reflective layer may be formed. Through such a manufacturing method, a layer of the same shape as the color filter, the reflective absorption layer, and the anti-reflective layer of FIG. 5 may be formed.

Still referring to FIG. 6, operations P110 to P160 may be included in a method of manufacturing an image sensor 1 at P102. In some example embodiments, a method may include incorporating the image sensor formed at P102 into a manufactured electronic device at P170. The electronic device may include, for example, one or more instances of processing circuitry such as hardware including logic circuits; a hardware/software combination such as a processor executing software; or any combination thereof, in addition to the image sensor 1 formed at P102. The processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a DRAM device, storing a program of instructions, and a processor (e.g., CPU) configured to execute the program of instructions to implement the functionality of the manufactured electronic device and/or any portions thereof.

The electronic device may include one or more image sensors 1 formed at P102. As a result, the electronic device may have improved light-sensing and/or image-generating performance based on including one or more image sensors 1 according to some example embodiments. In addition, as the image sensor 1 may be formed at P102 in a manufacturing process where the process temperature may be at or greater than 200 degrees C. without damaging the color filter 140 of the image sensor, the yield of manufacture of defect-free image sensors and/or electronic devices including same may thus be improved, and/or costs of manufacture thereof may be reduced, based on the method according to some example embodiments.

In the method of manufacturing the image sensor of the inventive concepts, a pattern may be formed in the reflective absorption layer before forming the anti-reflective layer. The pattern in the reflective absorption layer is described in detail in FIGS. 8A to 8F.

FIGS. 8A, 8B, 8C, 8D, 8E, and 8F are plan views for explaining the reflective absorption layer of the image sensor according to various example embodiments.

Figure 8A:
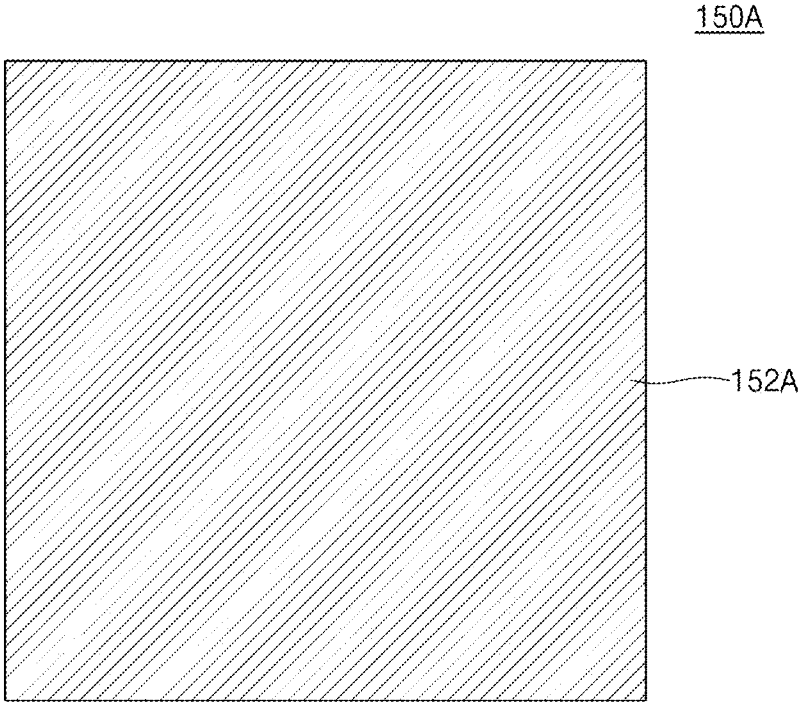
FIGS. 8A, 8B, 8C, 8D, 8E, and 8F are plan views for explaining the reflective absorption layer of the image sensor according to various example embodiments.

Referring to FIG. 8A, the reflective absorption layer 150A may include a metal layer 152A extending along the first direction (e.g., the X direction of FIG. 3) and the second direction (e.g., the Y direction of FIG. 3).

Figure 8B:
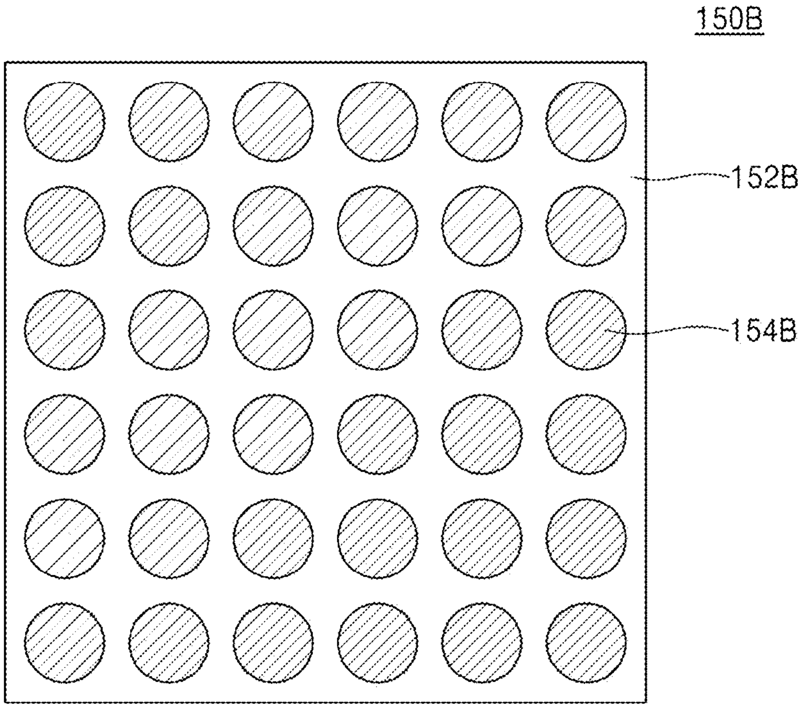
Figure 8C:
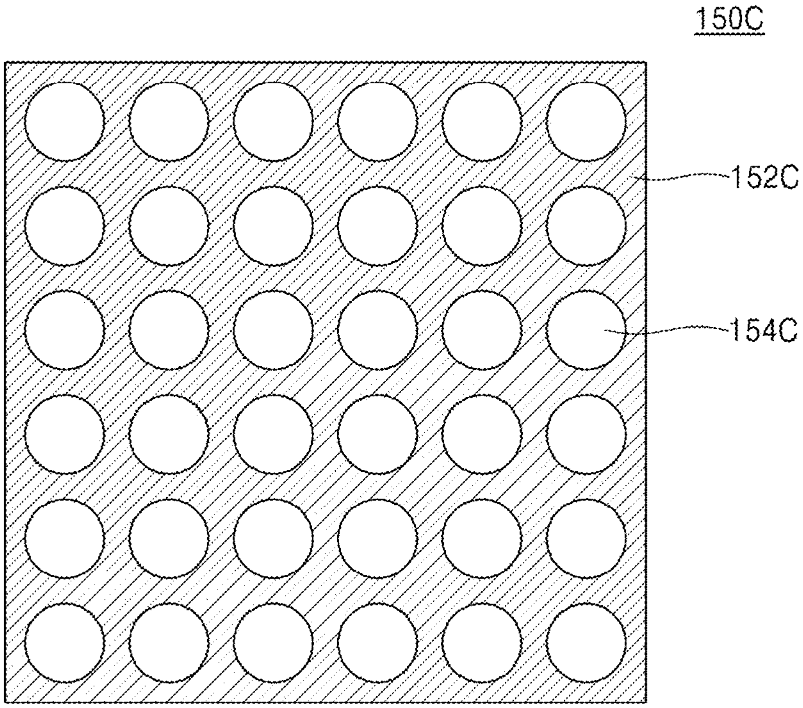

Referring to FIGS. 8B to 8C, a pattern may be formed in the reflective absorption layer 150 after forming the reflective absorption layer 150 on the plurality of dielectric layers. For example, referring to the reflective absorption layer 150B of FIG. 8B in which the pattern is formed, a circle pattern 154B may be arranged to form a matrix of circular-shaped portions of the reflective absorption layer 150B. A remaining portion 152B of the reflective absorption layer 150B may be etched (e.g., removed).

In addition, a reflective absorption layer 150C of FIG. 8C may be formed in an intaglio pattern, as opposed to the reflective absorption layer 150B of FIG. 8B. A circle pattern 154C portion may be etched to form a matrix of circular-shaped openings in, or etched portions of, the reflective absorption layer 150C, and a remaining portion 152C may consist of or include a metal.

Figure 8D:
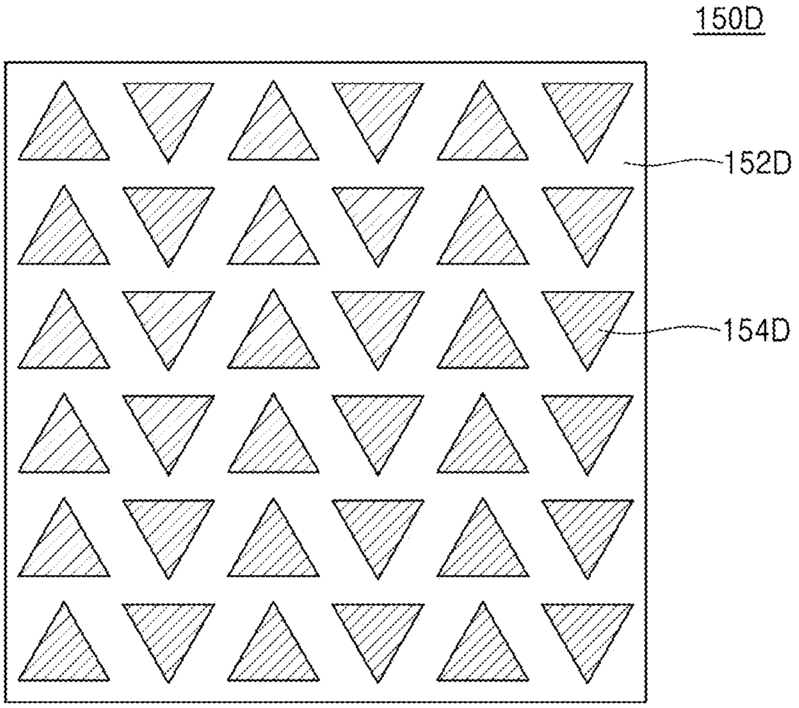
Figure 8E:
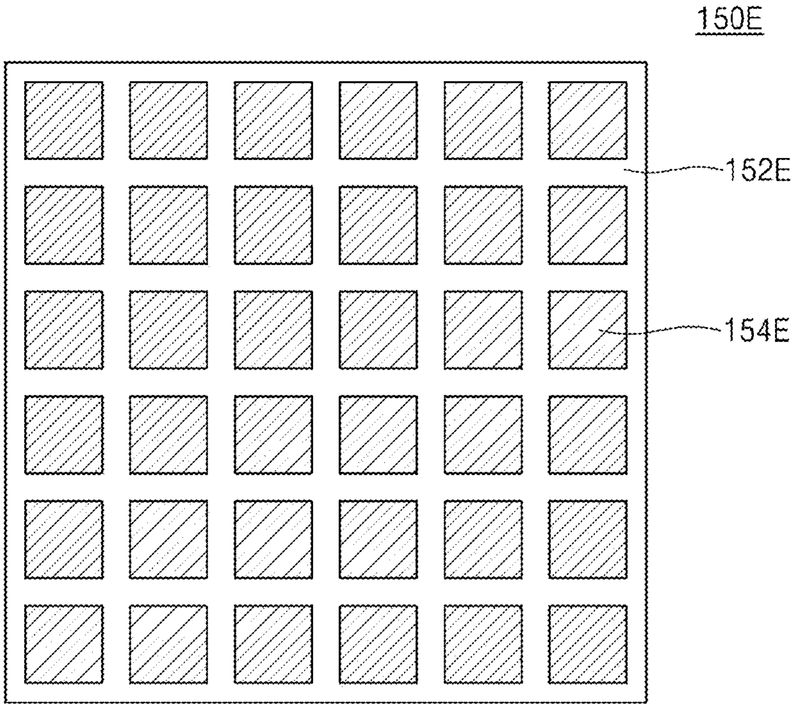

Referring to FIGS. 8D to 8E, in a reflective absorption layer 150D, a triangle pattern 154D may be arranged to form a matrix (e.g., matrix pattern) of triangle-shaped structures that are triangle-shaped spaced-apart portions of the reflective absorption layer 150D, and a remaining portion 152D may be etched (e.g., removed). Here, the triangle pattern 154D may include a plurality (e.g., matrix, array, etc.) of portions (e.g., structures) of the reflective absorption layer 150D that may each be triangles and vertically symmetric triangles that are alternately arranged. In some example embodiments, the triangle portions of the triangle pattern 154D may be arranged with a single shape (e.g., each portion of the triangle pattern 154D having a same triangle shape) without vertically symmetric shapes to form a matrix. In addition, in some example embodiments, the reflective absorption layer 150E may have a square pattern 154E in the form of a matrix (e.g., matrix pattern) of square-shaped structures that are square-shaped spaced-apart portions of the reflective absorption layer 150E, and a remaining portion 152E may be etched. In addition, although not shown in the drawing, in some example embodiments of the inventive concepts, a triangle pattern and a quadrangle pattern may be formed in an intaglio pattern similarly to FIG. 8C.

Figure 8F:
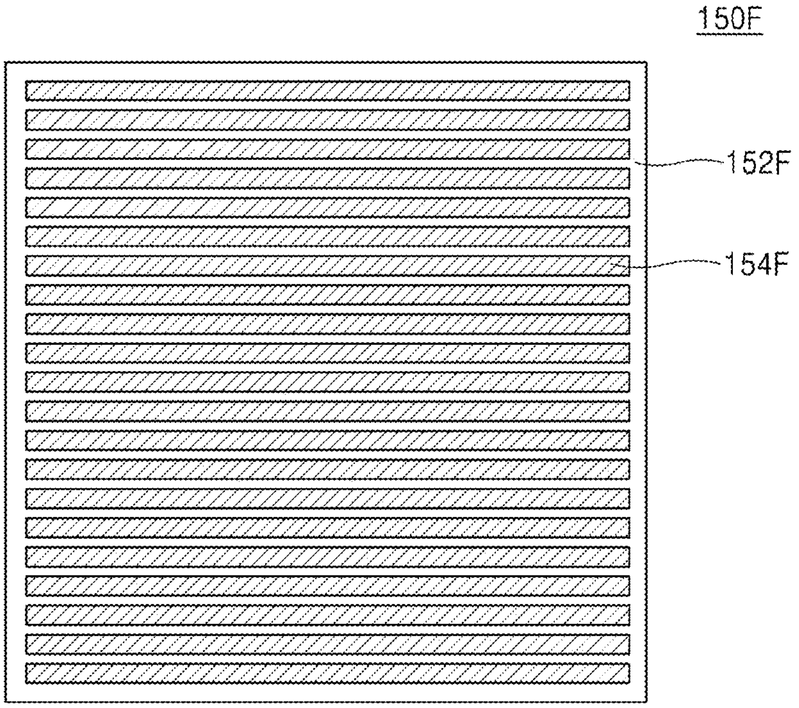

Referring to FIG. 8F, a reflective absorption layer 150F may form (e.g., define) a slit structure in which a plurality of rectangular patterns 154F are arranged to be apart (e.g., spaced apart) from each other. Similarly, remaining portions 152F may be etched.

As shown in FIGS. 8A to 8F, by forming various patterns in the reflective absorption layer 150, a plasmon resonance phenomenon or an extraordinary transmission phenomenon may occur, thereby controlling an absorption of the reflective absorption layer 150. Accordingly, the image sensor of the inventive concepts may inhibit a high reflectance of light in a certain wavelength range, which may occur in the image sensor of the related art employing inorganic material-based color filter, such that operational performance of an image sensor 1 including the reflective absorption layer 150 may be improved.

Figure 9:
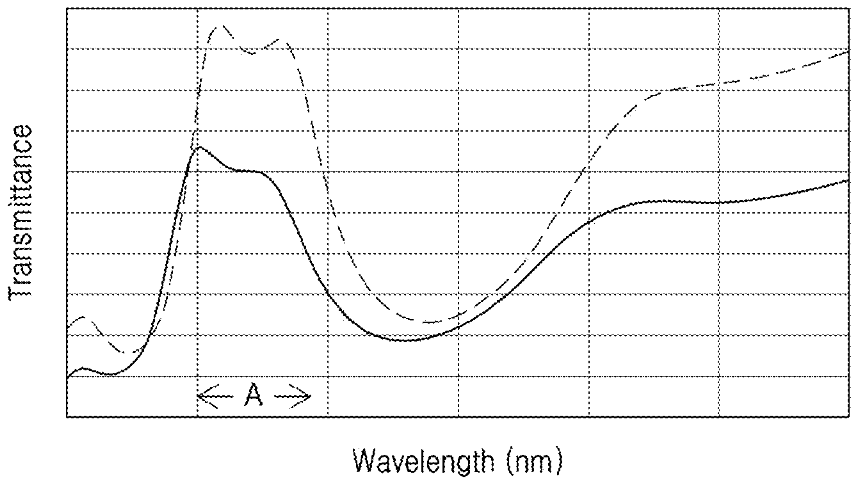
FIG. 9 is a graph illustrating a transmittance effect of the image sensor according to some example embodiments.
Figure 10:
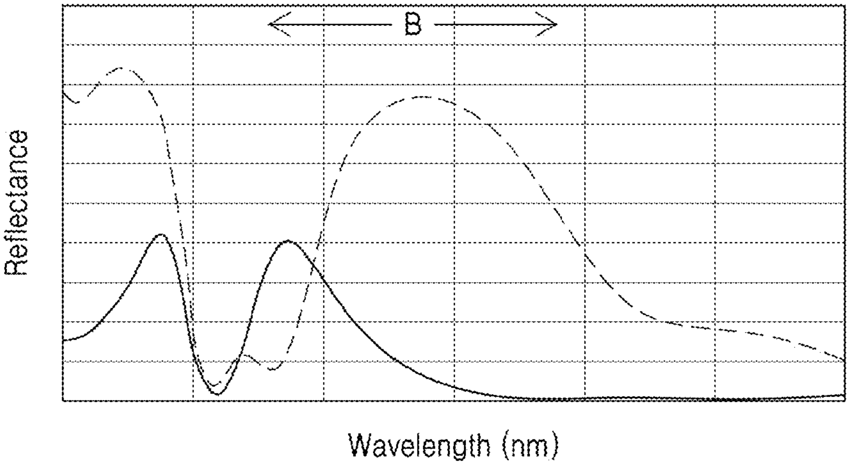
FIG. 10 is a graph illustrating a reflection effect of the image sensor according to some example embodiments.
Figure 11:
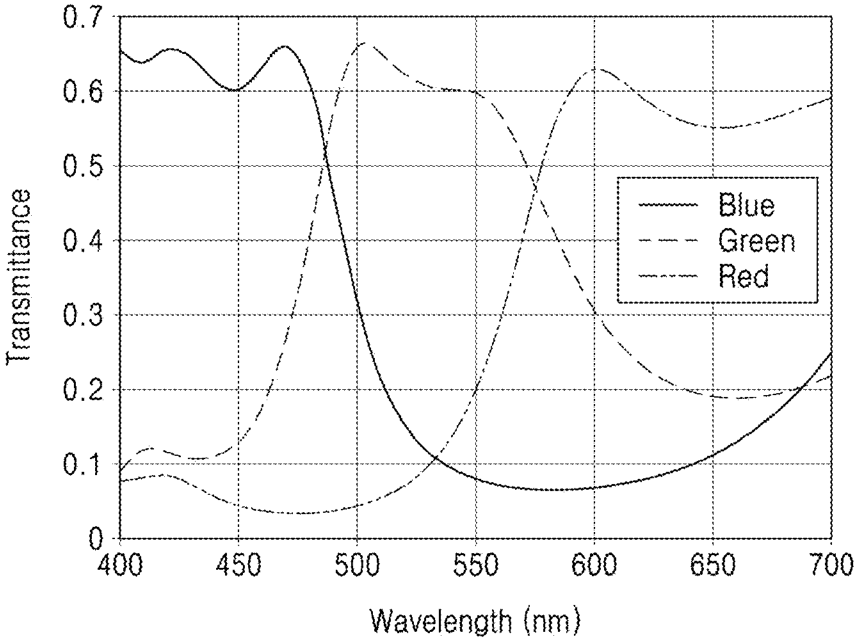
FIG. 11 is a graph illustrating a transmittance of each wavelength of an image sensor according to some example embodiments.

FIG. 9 is a graph illustrating a transmittance effect of an image sensor according to some example embodiments. FIG. 10 is a graph illustrating a reflection effect of an image sensor according to some example embodiments. FIG. 11 is a graph illustrating the transmittance of each wavelength of an image sensor according to some example embodiments. FIGS. 9 and 10 illustrate the transmittance effect and the reflection effect of a visible green ray.

Referring to FIG. 9, the horizontal axis indicates the wavelength (unit: nm), and the vertical axis indicates the transmittance (unit: percent). The dotted line indicates the transmittance of the image sensor of the related art employing inorganic material-based color filters with regard to the visible green ray, and the solid line indicates the transmittance of the image sensor of the inventive concepts with regard to the visible green ray. The image sensor of the related art includes a color filter having a stacked structure in which a plurality of first dielectric layers having a first refractive index and a plurality of second dielectric layers having a second refractive index are alternately arranged, and the color filter is a reflection-type color filter using a resonance mode. An A region indicates a wavelength band of the visible green ray. The image sensor of the inventive concepts is shown to have a partially reduced transmittance compared to the image sensor of the related art.

Referring to FIG. 10, the horizontal axis indicates the wavelength (unit: nm), and the vertical axis indicates the reflectance (unit: percent). The dotted line indicates the reflectance of the image sensor of the related art employing inorganic material-based color filters with regard to the visible green ray, and the solid line indicates the reflectance of the image sensor of the inventive concepts with regard to the visible green ray. A B region indicates a wavelength band of the visible green ray. The image sensor of the inventive concepts is shown to have a drastically reduced reflectance compared to the image sensor of the related art. In general, a conventional image sensor employing inorganic material-based color filters has good light separation characteristics or light filtering characteristics, but has a relatively large reflectance. However, the image sensor of the inventive concepts has a structure including an inorganic material-based color filter, a metal-based reflective absorption layer on the color filter, and an anti-reflective layer on the reflective absorption layer, and accordingly, the reflectance may be significantly reduced compared to the conventional image sensor.

Referring to FIG. 11, the horizontal axis indicates the wavelength (unit: nm), and the vertical axis indicates the transmittance (unit: percent). As shown in the graph, the image sensor of the inventive concepts have a high transmittance for visible blue, green and red rays.

Therefore, it is shown that the image sensor of the inventive concepts have reduced reflectance compared to the transmittance, and thus, the reflection of visible green rays is inhibited. Such a result was similarly shown in visible red rays and visible blue rays. Accordingly, the reliability of the image sensor of the inventive concepts may be improved.

As described herein, any devices, sensors, units, controllers, processors, and/or portions thereof according to any of the example embodiments (including, for example, the image sensor 1, the pixel array 10, the row driver 20, the ADC circuit 30, the timing controller 40, the processor 60, the processor 60, any portion thereof, or the like) may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a DRAM device, storing a program of instructions, and a processor (e.g., CPU) configured to execute the program of instructions to implement the functionality and/or methods performed by some or all of any devices, sensors, units, controllers, processors, according to any of the example embodiments, and/or any portions thereof.

While the inventive concepts have been particularly shown and described with reference to various example embodiments thereof, it will be understood that various changes in form and details may be made therein without departing from the spirit and scope of the following claims.

What is claimed is:

1. An image sensor, comprising:

a substrate including a plurality of photoelectric conversion devices;

a color filter on the substrate;

a reflective absorption layer on the color filter, the reflective absorption layer including at least one of tungsten, titanium, or aluminum;

an anti-reflective layer on the reflective absorption layer; and a plurality of micro lenses on the anti-reflective layer, wherein the color filter includes a plurality of dielectric layers extending in a first direction that is parallel to a rear surface of the substrate, the plurality of dielectric layers including a dielectric layer having a thickness in a second direction, the thickness varies along the first direction such that the plurality of dielectric layers have a thickness in the second direction that varies along the first direction, the first direction perpendicular to the second direction, wherein the plurality of dielectric layers include a plurality of portions including a first portion of the plurality of portions configured to transmit a first wavelength band of light and a second portion of the plurality of portions configured to transmit a second wavelength band of light, the thickness of the dielectric layer varies such that the thickness of the dielectric layer in the first portion is greater than the thickness of the dielectric layer in the second portion, the second wavelength band having a higher average wavelength than the first wavelength band.

2. The image sensor of claim 1, wherein the plurality of photoelectric conversion devices are arranged to define a matrix, and the plurality of dielectric layers comprise a first dielectric layer to an eighth dielectric layer, the first dielectric layer to the eighth dielectric layer are sequentially stacked on the plurality of photoelectric conversion devices.

3. The image sensor of claim 2, wherein each of the first dielectric layer to a third dielectric layer has a constant thickness in the second direction.

4. The image sensor of claim 2, wherein the plurality of photoelectric conversion devices comprise a first photoelectric conversion device, a second photoelectric conversion device, and a third photoelectric conversion device, the first photoelectric conversion device to the third photoelectric conversion device are separated from each other by a plurality of device isolation layers, and a thickness of a fourth dielectric layer of the first dielectric layer to the eighth dielectric layer on the first photoelectric conversion device is smaller than each of a thickness of the fourth dielectric layer on the second photoelectric conversion device, and a thickness of the fourth dielectric layer on the third photoelectric conversion device.

5. The image sensor of claim 4, wherein the thickness of the fourth dielectric layer on the second photoelectric conversion device is greater than the thickness of the fourth dielectric layer on the third photoelectric conversion device.

6. The image sensor of claim 4, wherein the dielectric layer is the eighth dielectric layer, a thickness of the eighth dielectric layer on the second photoelectric conversion device is greater than each of a thickness of the eighth dielectric layer on the first photoelectric conversion device, and a thickness of the eighth dielectric layer on the third photoelectric conversion device.

7. The image sensor of claim 4, wherein a thickness of the eighth dielectric layer on the first photoelectric conversion device is greater than a thickness of the eighth dielectric layer on the third photoelectric conversion device.

8. The image sensor of claim 4, wherein a portion of the plurality of dielectric layers overlapping the first photoelectric conversion device in the second direction is configured to act as a blue filter which transmits visible blue rays of external light that is incident on the color filter to the first photoelectric conversion device and blocks visible green rays and visible red rays of the external light from propagating through the color filter to the first photoelectric conversion device.

9. The image sensor of claim 4, wherein a portion of the plurality of dielectric layers overlapping the second photoelectric conversion device in the second direction is configured to act as a green filter which transmits visible green rays of external light that is incident on the color filter to the second photoelectric conversion device and blocks visible blue rays and visible red rays of the external light from propagating through the color filter to the second photoelectric conversion device.

10. The image sensor of claim 4, wherein a portion of the plurality of dielectric layers overlapping the third photoelectric conversion device in the second direction is configured to act as a red filter which transmits visible red rays of external light that is incident on the color filter to the third photoelectric conversion device and blocks visible blue rays and visible green rays of the external light from propagating through the color filter to the third photoelectric conversion device.

11. The image sensor of claim 1, wherein the reflective absorption layer extends in the first direction parallel to the rear surface of the substrate and has a width in a third direction parallel to the rear surface of the substrate and perpendicular to the first direction.

12. The image sensor of claim 1, wherein the reflective absorption layer includes a pattern of structures having any one of a circular shape, a quadrangular shape, or a triangular shape, the pattern of structures spaced apart from each other in both the first direction and a third direction parallel to the rear surface of the substrate and perpendicular to the first direction to define a matrix structure.

13. The image sensor of claim 12, wherein the reflective absorption layer is configured to re-reflect light that is reflected from the plurality of dielectric layers toward the reflective absorption layer, such that light that is re-reflected by the reflective absorption layer is reflected toward the plurality of dielectric layers.

14. An image sensor, comprising:

a substrate including a plurality of photoelectric conversion devices;

a color filter on the substrate;

a reflective absorption layer on the color filter, the reflective absorption layer including at least one of tungsten, titanium, or aluminum;

an anti-reflective layer on the reflective absorption layer;

micro lenses that are spaced apart from the substrate with the color filter therebetween, the micro lenses on the reflective absorption layer;

a plurality of conductive patterns configured to define at least one conductive path to output electrical signals generated by the plurality of photoelectric conversion devices; and an interlayer insulating layer covering the plurality of conductive patterns, wherein the color filter includes a plurality of dielectric layers extending in a first direction parallel to a rear surface of the substrate and sequentially stacked in a second direction perpendicular to the rear surface of the substrate and perpendicular to the first direction, wherein the plurality of dielectric layers include a first dielectric layer to an eighth dielectric layer sequentially stacked on the plurality of photoelectric conversion devices in the second direction, wherein the reflective absorption layer is configured to re-reflect light reflected from the plurality of dielectric layers toward the reflective absorption layer, such that light re-reflected by the reflective absorption layer is reflected toward the plurality of dielectric layers, wherein the plurality of dielectric lavers includes a dielectric layer having a thickness in a second direction, the thickness varies along the first direction, and wherein the plurality of dielectric lavers includes a plurality of portions including a first portion of the plurality of portions configured to transmit a first wavelength band of light and a second portion of the plurality of portions configured to transmit a second wavelength band of light, the thickness of the dielectric layer varies such that the thickness of the dielectric layer in the first portion is greater than the thickness of the dielectric layer in the second portion, the second wavelength band having a higher average wavelength than the first wavelength band.

15. The image sensor of claim 14, wherein the plurality of photoelectric conversion devices comprise a first photoelectric conversion device, a second photoelectric conversion device, and a third photoelectric conversion device, the first photoelectric conversion device to the third photoelectric conversion device are separated from each other by a plurality of device isolation layers, a fourth dielectric layer of the first dielectric layer to the eighth dielectric layer comprises a 4-$1^{st}$ dielectric layer on the second photoelectric conversion device and a 4-$2^{nd}$ dielectric layer on the third photoelectric conversion device, and the fourth dielectric layer is not on the first photoelectric conversion device such that the first photoelectric conversion device is exposed from the fourth dielectric layer in the second direction.

16. The image sensor of claim 15, wherein a thickness of the 4-$1^{st}$ dielectric layer is greater than a thickness of the 4-$2^{nd}$ dielectric layer.

17. The image sensor of claim 15, wherein the dielectric layer is the eighth dielectric layer, the eighth dielectric layer comprises a 8-$1^{st}$ dielectric layer on the first photoelectric conversion device, a 8-$2^{nd}$ dielectric layer on the second photoelectric conversion device, and a 8-$3^{rd}$ dielectric layer on the third photoelectric conversion device, and a thickness of the 8-$2^{nd}$ dielectric layer is greater than a thickness of the 8-$1^{st}$ dielectric layer, and the thickness of the 8-$1^{st}$ dielectric layer is greater than a thickness of the 8-$3^{rd}$ dielectric layer.

18. An image sensor, comprising:

a substrate including a plurality of photoelectric conversion devices that define a matrix;

a color filter on the substrate, the color filter including a blue filter, a green filter, and a red filter on separate, respective photoelectric conversion devices of the plurality of photoelectric conversion devices;

a reflective absorption layer on the color filter, the reflective absorption layer including at least one of tungsten, titanium, or aluminum;

an anti-reflective layer configured to transmit visible rays, the anti-reflective layer on the reflective absorption layer;

micro lenses configured to focus external light on the plurality of photoelectric conversion devices, the micro lenses spaced apart from the substrate with the color filter therebetween and on the reflective absorption layer;

a plurality of conductive patterns configured to define at least one conductive path to output electrical signals generated by the plurality of photoelectric conversion devices; and an interlayer insulating layer covering the plurality of conductive patterns, wherein the color filter includes a plurality of dielectric layers extending in a first direction parallel to a rear surface of the substrate and sequentially stacked in a second direction perpendicular to the rear surface of the substrate and perpendicular to the first direction, wherein the plurality of dielectric layers comprise a first dielectric layer to an eighth dielectric layer sequentially stacked on the plurality of photoelectric conversion devices in the second direction, wherein the reflective absorption layer is configured to re-reflect external light reflected from the plurality of dielectric layers toward the reflective absorption layer, such that light reflected by the reflective absorption layer is reflected toward to the plurality of dielectric layers, wherein the plurality of dielectric lavers includes a dielectric layer having a thickness in a second direction, the thickness varies along the first direction, and wherein the plurality of dielectric layers includes a plurality of portions including a first portion of the plurality of portions configured to transmit a first wavelength band of light and a second portion of the plurality of portions configured to transmit a second wavelength band of light, the thickness of the dielectric layer varies such that the thickness of the dielectric layer in the first portion is greater than the thickness of the dielectric layer in the second portion, the second wavelength band having a higher average wavelength than the first wavelength band.

19. The image sensor of claim 18, wherein the anti-reflective layer includes a substance having a refractive index of 1.5 or less.

20. The image sensor of claim 18, wherein a thickness of the reflective absorption layer is 10 nm or less.

* * * * *